(12) United States Patent
Ozaki et al.

(10) Patent No.: US 11,688,663 B2
(45) Date of Patent: Jun. 27, 2023

(54) SEMICONDUCTOR DEVICE, SEMICONDUCTOR DEVICE FABRICATION METHOD, AND ELECTRONIC DEVICE

(71) Applicant: FUJITSU LIMITED, Kawasaki (JP)

(72) Inventors: Shirou Ozaki, Yamato (JP); Toshihiro Ohki, Hadano (JP); Kozo Makiyama, Kawasaki (JP); Junya Yaita, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 287 days.

(21) Appl. No.: 17/096,995

(22) Filed: Nov. 13, 2020

(65) Prior Publication Data
US 2021/0225728 A1    Jul. 22, 2021

(30) Foreign Application Priority Data

Jan. 21, 2020  (JP) .............................. JP2020-007804

(51) Int. Cl.
| | |
|---|---|
| H01L 29/66 | (2006.01) |
| H01L 23/373 | (2006.01) |
| H01L 29/778 | (2006.01) |
| H01L 29/423 | (2006.01) |
| H01L 29/40 | (2006.01) |
| H01L 29/417 | (2006.01) |

(52) U.S. Cl.
CPC ........ *H01L 23/3732* (2013.01); *H01L 29/401* (2013.01); *H01L 29/41775* (2013.01); *H01L 29/42316* (2013.01); *H01L 29/66462* (2013.01); *H01L 29/7786* (2013.01)

(58) Field of Classification Search
CPC combination set(s) only.
See application file for complete search history.

(56) References Cited

U.S. PATENT DOCUMENTS

2009/0146186 A1*  6/2009  Kub .................. H01L 29/42316
                                                    257/E29.315

FOREIGN PATENT DOCUMENTS

| JP | 2016-167522 A | 9/2016 |
| JP | 2019-71339 A  | 5/2019 |

* cited by examiner

*Primary Examiner* — Moin M Rahman
(74) *Attorney, Agent, or Firm* — Fujitsu Patent Center

(57) ABSTRACT

A semiconductor device includes a source electrode and a drain electrode located over a surface of a semiconductor layer including an electron transit layer and an electron supply layer. A gate electrode is located between the source electrode and the drain electrode. A first diamond layer is located between the source electrode and the drain electrode over the surface with an insulating film therebetween. A second diamond layer is located directly on the surface between the gate electrode and the drain electrode. Of heat generated by the semiconductor layer of the semiconductor device in operation, heat on the side of the electrode on which a relatively strong electric field is applied is efficiently transferred to the second diamond layer. The semiconductor device achieves an excellent heat dissipation property from the semiconductor layer and effectively suppresses overheating and a failure and degradation of the characteristics due to the overheating.

10 Claims, 21 Drawing Sheets

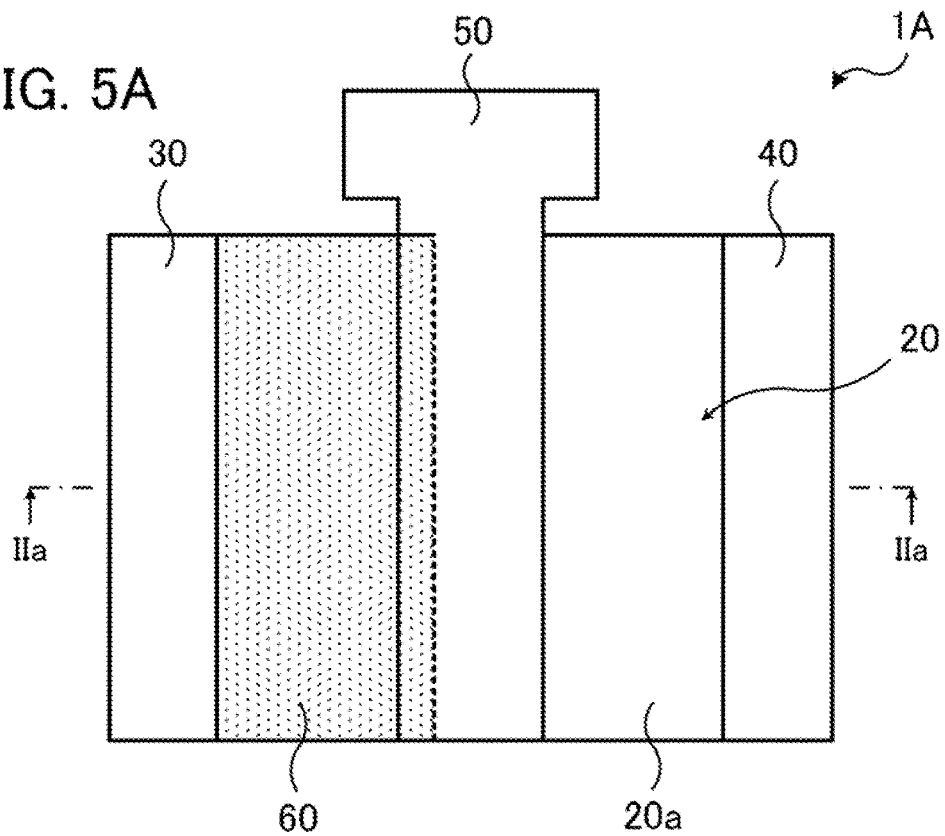
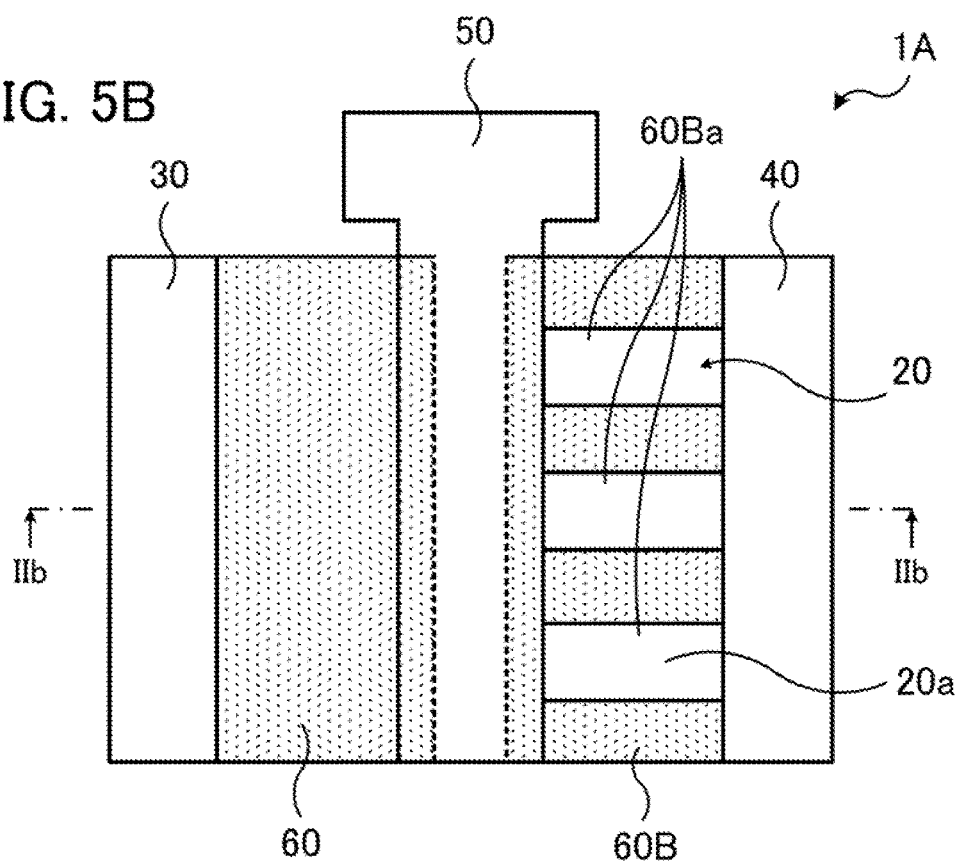

SEMICONDUCTOR DEVICE, SEMICONDUCTOR DEVICE FABRICATION METHOD, AND ELECTRONIC DEVICE

CROSS-REFERENCE TO RELATED APPLICATION

This application is based upon and claims the benefit of priority of the prior Japanese Patent Application No. 2020-007804, filed on Jan. 21, 2020, the entire contents of which are incorporated herein by reference.

FIELD

The embodiments discussed herein are related to a semiconductor device, a semiconductor device fabrication method, and an electronic device.

BACKGROUND

Semiconductor devices including field effect transistors (FETs) in which a source electrode and a drain electrode are located over a semiconductor layer and in which a gate electrode is located between the source electrode and the drain electrode are known. With such semiconductor devices the following technique is known. A protection film, such as silicon nitride (SiN), is located over a semiconductor layer. A diamond layer having high thermal conductivity is located over the protection film between a gate electrode and a source electrode and over the protection film between the gate electrode and a drain electrode.

See, for example, Japanese Laid-open Patent Publication No. 2019-71339 and Japanese Laid-open Patent Publication No. 2016-167522.

With a semiconductor device a comparatively strong electric field is applied to a drain electrode at operation time. As a result, much heat is apt to be generated at the drain electrode. In order to improve the heat dissipation property of the drain electrode, the above diamond layer may be located. However, if a protection film having thermal conductivity lower than that of the diamond layer intervenes between a semiconductor layer on the drain electrode side and the diamond layer, then heat transfer from the semiconductor layer to the diamond layer is suppressed. If heat transfer from the semiconductor layer to the diamond layer is suppressed by the protection film, then the semiconductor device overheats and therefore the possibility of a failure or degradation of the characteristics increases.

SUMMARY

According to an aspect, there is provided a semiconductor device including a semiconductor layer, a source electrode and a drain electrode located apart from each other over a first surface of the semiconductor layer, a gate electrode located between the source electrode and the drain electrode, a first insulating film located between the gate electrode and the source electrode over the first surface, a first diamond layer located over a second surface of the first insulating film opposite to the first surface, and a second diamond layer located between the gate electrode and the drain electrode over the first surface so as to be in contact with the first surface.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5A and 5B are views for describing an example of a planar layout of an insulating film of the semiconductor device according to the second embodiment;

DESCRIPTION OF EMBODIMENTS

First Embodiment

Figure 1:
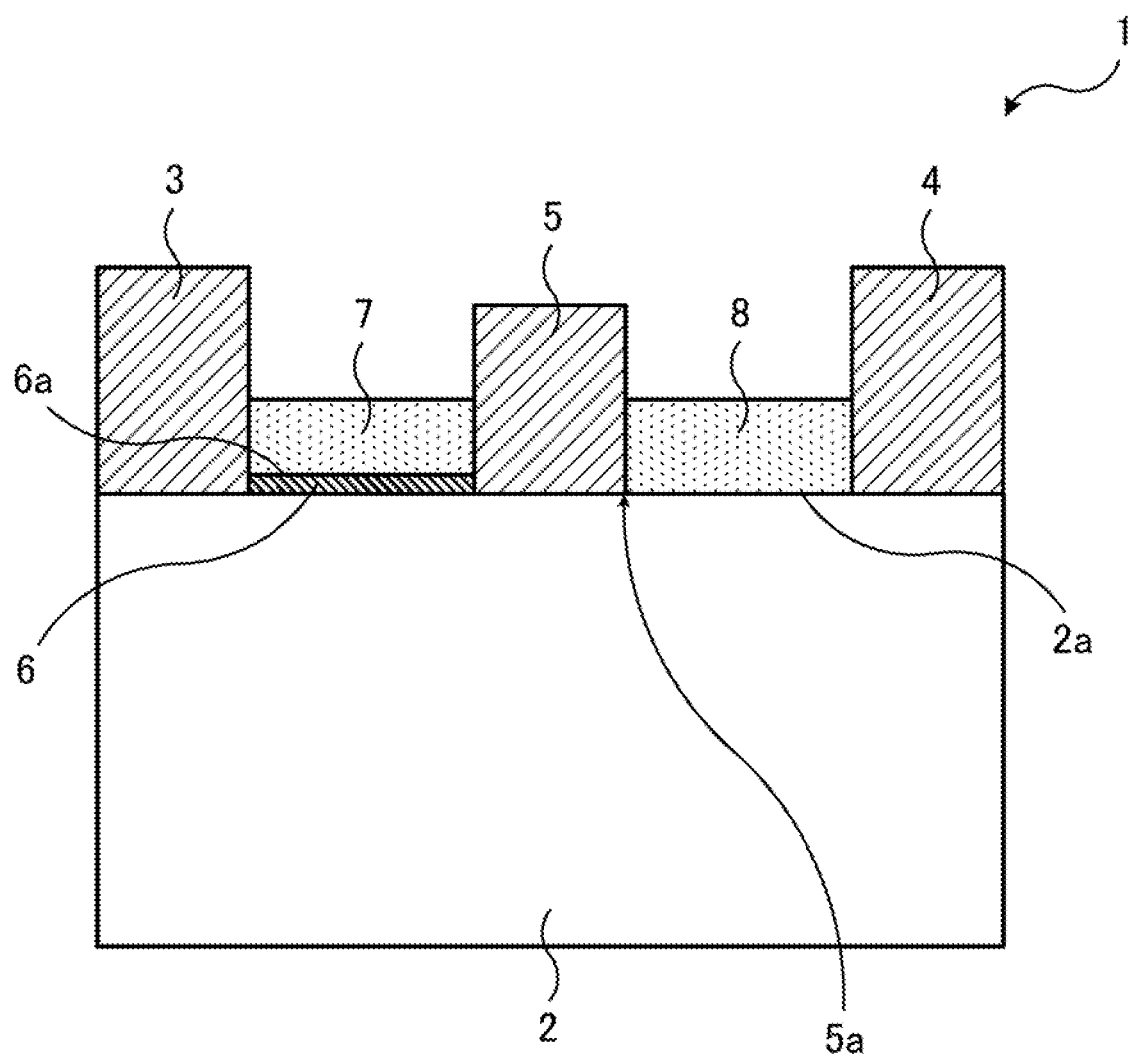
FIG. 1 is a view for describing an example of a semiconductor device according to a first embodiment.

FIG. 1 is a view for describing an example of a semiconductor device according to a first embodiment. FIG. 1 is a fragmentary schematic sectional view of an example of a semiconductor device.

A semiconductor device 1 illustrated in FIG. 1 is an example of an FET. The semiconductor device 1 includes a semiconductor layer 2, a source electrode 3, a drain electrode 4, a gate electrode 5, an insulating film 6, a diamond layer 7, and a diamond layer 3.

For example, one semiconductor layer or a laminated structure of two or more semiconductor layers is used as the semiconductor layer 2. For example, the one semiconductor layer or each of the two or more semiconductor layers included in the semiconductor layer 2 is formed by the use of a compound semiconductor. A group III-V compound semiconductor, such as gallium nitride (GaN), indium phosphorus (InP), or gallium arsenide (GaAs), is used as such a compound semiconductor. Furthermore, a group IV compound semiconductor, such as silicon carbide (SiC) or silicon germanium (SiGe), is used as such a compound semiconductor. Moreover, a group IV semiconductor, such as silicon (Si) or germanium (Ge), may be used for forming the semiconductor layer 2. The one semiconductor layer or at least one of the two or more semiconductor layers included in the semiconductor layer 2 may be doped with a determined impurity element.

The source electrode 3 and the drain electrode 4 are located over one surface 2a of the semiconductor layer 2 apart from each other. The gate electrode 5 is located between the source electrode 3 and the drain electrode 4. The source electrode 3, the drain electrode 4, and the gate electrode 5 are formed by the use of various conductive materials. For example, the source electrode 3, the drain electrode 4, and the gate electrode 5 are formed by the use of a metal material.

The insulating film 6 is located between the gate electrode 5 and the source electrode 3 over the surface 2a of the semiconductor layer 2. The insulating film 6 is formed by the use of various insulating materials. For example, the insulating film 6 is formed by the use of SiN or aluminum oxide ($Al_2O_3$ or AlO). Furthermore, the insulating film 6 may be formed by the use of silicon oxide ($SiO_2$ or SiO), silicon oxynitride (SiON), aluminum nitride (AlN), aluminum oxynitride (AlON), or the like. The insulating film 6 may have a single-layer structure of one kind of insulating material or a laminated structure of the same kind of insulating material or different kinds of insulating materials. The insulating film 6 has a function as a protection film which protects the surface 2a of the semiconductor layer 2.

The diamond layer 7 is located over a surface 6a of the insulating film 6 opposite to the surface 2a of the semiconductor layer 2. The thermal conductivity of the diamond layer 7 is higher than that of the semiconductor layer 2 and the insulating film 6. The diamond layer 7 is a polycrystalline diamond layer formed by the use of a chemical vapor deposition (CVD) method or the like. A laminated structure of plural kinds of polycrystalline diamond layers including crystal grain groups which differ in grain size distribution may be used as the diamond layer 7.

The diamond layer 8 is located between the gate electrode 5 and the drain electrode 4 over the surface 2a of the semiconductor layer 2. The diamond layer 8 is located in contact with the surface 2a of the semiconductor layer 2 between the gate electrode 5 and the drain electrode 4. The thermal conductivity of the diamond layer 8 is higher than that of the semiconductor layer 2. The diamond layer 8 is a polycrystalline diamond layer formed by the use of the CVD method or the like. A laminated structure of plural kinds of polycrystalline diamond layers including crystal grain groups which differ in grain size distribution may be used as the diamond layer 8.

For example, when the semiconductor device 1 having the above structure operates, a determined voltage is applied between the gate electrode 5 and the source electrode 3 with the gate electrode 5 side as a high potential and a determined voltage is applied between the drain electrode 4 and the source electrode 3 with the drain electrode 4 side as a high potential. The semiconductor layer 2 generates heat as a result of the operation of the semiconductor device 1. When a comparatively high voltage is applied to the drain electrode 4 in the semiconductor device 1, much heat is generated by the drain electrode 4 because an electric field applied to the drain electrode 4 is stronger than an electric field applied to the source electrode 3. Heat generated at an edge (referred to as a "drain side gate edge") 5a of the gate electrode 5 on the drain electrode 4 side at which electric field concentration occurs is apt to become significant.

As illustrated in FIG. 1, with the semiconductor device 1 the diamond layer 8 having high thermal conductivity is located between the gate electrode 5 and the drain electrode 4 so as to be in contact with the surface 2a of the semiconductor layer 2. As a result, heat generated by the semiconductor layer 2 is efficiently transferred to the diamond layer 8. Furthermore, as illustrated in FIG. 1, with the semiconductor device 1 the drain side gate edge 5a at which heat generated is apt to become significant is located so as to be in contact with the diamond layer 8. Accordingly, heat generated at the drain side gate edge 5a is efficiently transferred from the drain side gate edge 5a to the diamond layer 8, compared with a case where the drain side gate edge 5a is not in contact with the diamond layer 8.

As a result, heat generated by the semiconductor layer 2 as a result of the operation of the semiconductor device 1 is efficiently transferred to the diamond layer 8 and is efficiently dissipated via the diamond layer 8. This suppresses a rise in the temperature of the semiconductor layer 2. As a result, an overheat of the semiconductor device 1 or a failure or degradation of the characteristics of the transistor caused by it is effectively suppressed.

Usually a voltage applied between the gate electrode 5 and the source electrode 3 is lower than a voltage applied between the gate electrode 5 and the drain electrode 4. As a result, heat generated between the gate electrode 5 and the source electrode 3 is less than heat generated between the gate electrode 5 and the drain electrode 4 or heat generated at the drain side gate edge 5a. Accordingly, as illustrated in FIG. 1, the diamond layer 7 is located between the gate electrode 5 and the source electrode 3 over the surface 2a of the semiconductor layer 2 with the insulating film 6 therebetween. The surface 2a of the semiconductor layer 2 is effectively protected by locating the insulating film 6 between the gate electrode 5 and the source electrode 3. Heat transferred from the semiconductor layer 2 via the insulating film 6 or heat transferred from the semiconductor layer 2 via the gate electrode 5 or the source electrode 3 is efficiently dissipated by the diamond layer 7 located over the insulating film 6.

Second Embodiment

Figure 2:
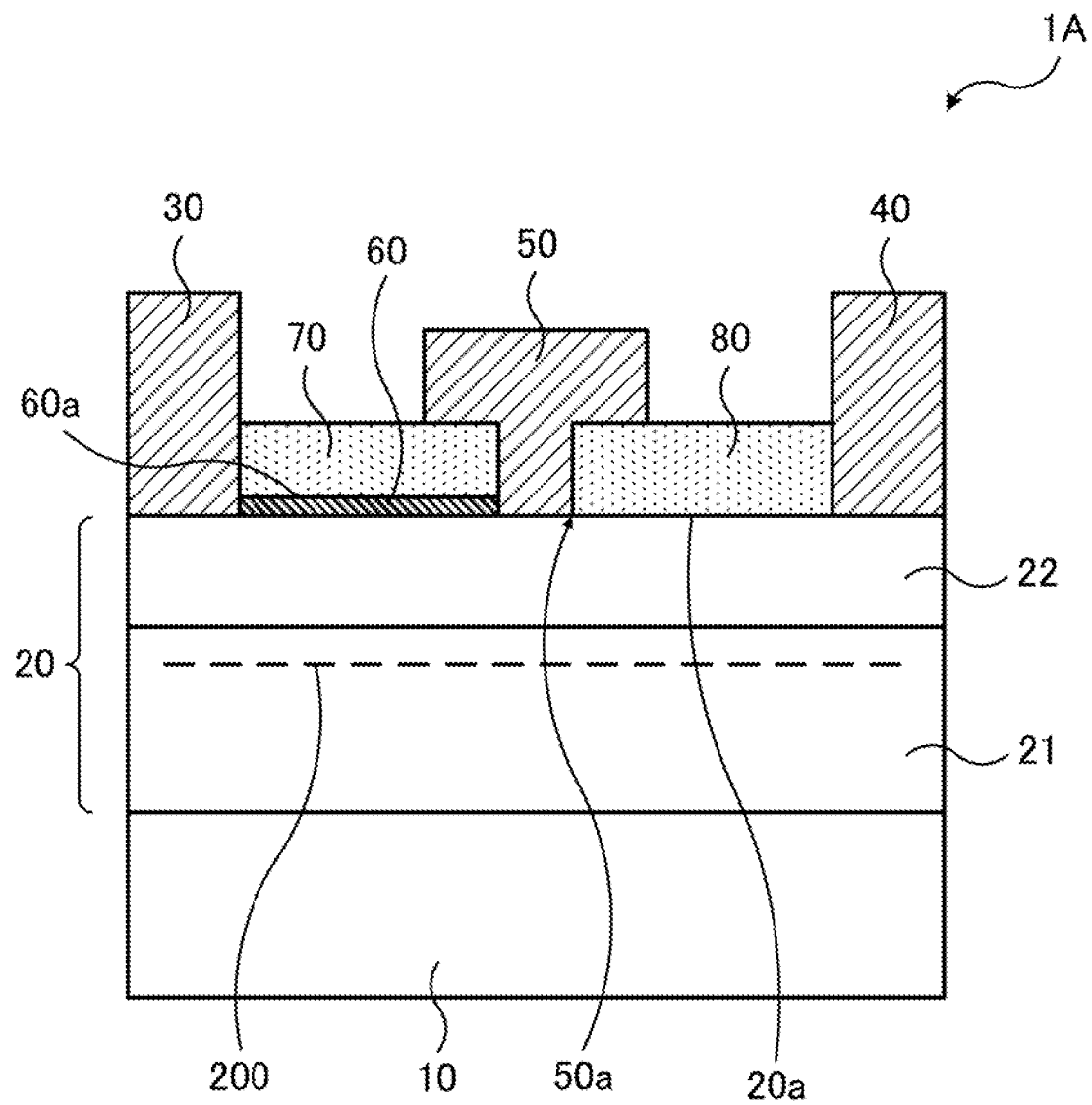
FIG. 2 is a view for describing an example of a semiconductor device according to a second embodiment.

FIG. 2 is a view for describing an example of a semiconductor device according to a second embodiment. FIG. 2 is a fragmentary schematic sectional view of an example of a semiconductor device.

A semiconductor device 1A illustrated in FIG. 2 is an example of a high electron mobility transistor (HEMT). The semiconductor device 1A includes a substrate 10, a semiconductor layer 20, a source electrode 30, a drain electrode 40, a gate electrode 50, an insulating film 60, a diamond layer 70, and a diamond layer 80.

For example, an SiC substrate is used as the substrate 10. An SiC substrate may be a semi-insulating substrate or a conductive substrate. An Si substrate, a sapphire substrate, a GaN substrate, a diamond substrate, or the like may be used as the substrate 10 in place of an SiC substrate.

For example, the semiconductor layer 20 includes an electron transit layer 21 and an electron supply layer 22.

As illustrated in FIG. 2, the electron transit layer 21 is located over the substrate 10. The electron transit layer 21 is formed by the use of a nitride semiconductor such as GaN. Alternatively, the electron transit layer 21 may be formed by the use of a nitride semiconductor such as indium gallium nitride (InGaN), aluminum gallium nitride (AlGaN), or indium aluminum gallium nitride (InAlGaN). The electron transit layer 21 may have a single-layer structure of one kind of nitride semiconductor or a laminated structure of one kind of nitride semiconductor or two or more kinds of nitride semiconductors. For example, the electron transit layer 21 is formed by the use of an undoped nitride semiconductor. The electron transit layer 21 is formed over the substrate 10 by the use of a metal organic chemical vapor deposition (MOCVD) or metal organic vapor phase epitaxy (MOVPE) method or a molecular beam epitaxy (MBE) method. The electron transit layer 21 is also referred to as a channel layer.

As illustrated in FIG. 2, the electron supply layer 22 is located over the electron transit layer 21. The electron supply layer 22 is formed by the use of a nitride semiconductor such as AlGaN. Alternatively, the electron supply layer 22 may be formed by the use of a nitride semiconductor such as indium aluminum nitride (InAlN), InAlGaN, or AlN. The electron supply layer 22 may have a single-layer structure of one kind of nitride semiconductor or a laminated structure of one kind of nitride semiconductor or two or more kinds of nitride semiconductors. For example, the electron supply layer 22 is formed by the use of an n-type nitride semiconductor. The electron supply layer 22 is formed over the electron transit layer 21 by the use of the MOVPE method or the MBE method. The electron supply layer 22 is also referred to as a barrier layer.

The electron transit layer 21 and the electron supply layer 22 are formed by the use of nitride semiconductors which differ in band gap. A hetero junction structure having band discontinuity is formed by locating over the electron transit layer 21 the electron supply layer 22 formed by the use of a nitride semiconductor having a band gap larger than that of a nitride semiconductor used for forming the electron transit layer 21. A Fermi level is made higher (high energy side) than a conduction band at a junction interface between the electron transit layer 21 and the electron supply layer 22. By doing so, a two dimensional electron gas (2DEG) 200 is generated in the electron transit layer 21 at the junction interface. The electron supply layer 22 formed by the use of a nitride semiconductor having a lattice constant larger than that of a nitride semiconductor used for forming the electron transit layer 21 is located over the electron transit layer 21. By doing so, piezo polarization occurs in the electron supply layer 22. The 2DEG 200 of high concentration is generated in the electron transit layer 21 at the junction interface as a result of piezo polarization caused by spontaneous polarization of a nitride semiconductor used for forming the electron supply layer 22 and its lattice constant. A combination of nitride semiconductors by which this 2DEG 200 is generated near the junction interface between the electron transit layer 21 and the electron supply layer 22 is used for forming the electron transit layer 21 and the electron supply layer 22.

A layer made of AlN or the like may be located as an initial layer (not illustrated) between the substrate 10 and the electron transit layer 21. Furthermore, a layer made of AlGaN or the like may be located as a buffer layer (not illustrated) between the substrate 10 and the electron transit layer 21. A layer made of undoped AlGaN (i-type AlGaN) or the like may be located as a spacer layer (not illustrated) between the electron transit layer 21 and the electron supply layer 22. Moreover, a layer made of n-type GaN or the like may be located as a cap layer (not illustrated) over the electron supply layer 22. The semiconductor layer 20 may include one or more of an initial layer, a buffer layer, a spacer layer, and a cap layer.

The source electrode 30 and the drain electrode 40 are located apart from each other over one surface 20a of the semiconductor layer 20, that is to say, over the electron supply layer 22 in the example of FIG. 2. Each of the source electrode 30 and the drain electrode 40 functions as an ohmic electrode. As long as each of the source electrode 30 and the drain electrode 40 functions as an ohmic electrode, the source electrode 30 and the drain electrode 40 may be connected to the electron supply layer 22 or may pierce the electron supply layer 22 and be connected to the electron transit layer 21. Furthermore, a contact layer made of a nitride semiconductor, such as n-type GaN, may be located under the source electrode 30 and the drain electrode 40. The source electrode 30 and the drain electrode 40 are formed by the use of a metal material. For example, a metal electrode having titanium (Ti) and aluminum (Al) located thereon is used as each of the source electrode 30 and the drain electrode 40. The source electrode 30 and the drain electrode 40 are formed by the use of an evaporation method or the like.

The gate electrode 50 is located between the source electrode 30 and the drain electrode 40. The gate electrode 5C is located over the one surface 20a of the semiconductor layer 20, that is to say, ever the electron supply layer 22 in the example of FIG. 2. A cap layer made of GaN or the like or an insulating film made of oxide, nitride, oxynitride, or the like may intervene between the gate electrode 50 and the electron supply layer 22. The gate electrode 50 functions as a Schottky electrode or a Schottky gate electrode. The gate electrode 50 is formed by the use of a metal material. For example, a metal electrode having nickel (Ni) and gold (Au) located thereon is used as the gate electrode 50. The gate electrode 50 is formed by the use of the evaporation method or the like.

The insulating film 60 is located over the one surface 20a of the semiconductor layer 20, that is to say, over the electron supply layer 22 in the example of FIG. 2 between the gate electrode 50 and the source electrode 30. A cap layer made of GaN or the like may intervene between the insulating film 60 and the electron supply layer 22. The insulating film 60 has the function of protecting the semiconductor layer 20 (electron supply layer 22 and the cap layer), for example, the function of protecting an area of the semiconductor layer 20 against an atmosphere in which the diamond layer 70 is formed. The insulating film 60 is formed by the use of SiN or the like. Alternatively, the insulating film 60 is formed by the use of AlN. Furthermore, $SiO_2$ or the like may be laminated over SiN or the like.

The diamond layer 70 is located over a surface 60a of the insulating film 60 opposite to the surface 20a of the semiconductor layer 20. The thermal conductivity of the diamond layer 70 is higher than that of the semiconductor layer 20 and the insulating film 60. The diamond layer 70 has the function of transferring heat transferred from the semiconductor layer 20 via the insulating film 60, heat transferred from the semiconductor layer 20 via the gate electrode 50 and the source electrode 30, and the like and dissipating them to the outside of the diamond layer 70. The diamond layer 70 is a polycrystalline diamond layer formed by the CVD method. In this case, for example, methane ($CH_4$) and hydrogen ($H_2$) are used as material gas and film formation temperature is 700 to 900° C. A laminated structure of plural kinds of polycrystalline diamond layers including crystal grain groups which differ in grain size distribution may be used as the diamond layer 70.

The diamond layer 80 is located over the surface 20a of the semiconductor layer 20, that is to say, over the electron supply layer 22 in the example of FIG. 2 between the gate electrode 50 and the drain electrode 40. The diamond layer 80 is located so as to be in contact with the surface 20a of the semiconductor layer 20. That is to say, the diamond layer 80 is located directly on the surface 20a of the semiconductor layer 20. The thermal conductivity of the diamond layer 80 is higher than that of the semiconductor layer 20. The diamond layer 80 has the function of transferring heat transferred from the semiconductor layer 20, heat transferred from the semiconductor layer 20 via the gate electrode 50 and the drain electrode 40, and the like and dissipating them to the outside of the diamond layer 80. The diamond layer 80 is a polycrystalline diamond layer formed by the CVD method. In this case, for example, $CH_4$ and $H_2$ are used as material gas and film formation temperature is 700 to 900° C. A laminated structure of plural kinds of polycrystalline diamond layers including crystal grain groups which differ in grain size distribution may be used as the diamond layer 80.

For example, when the semiconductor device 1A having the above structure operates, a determined voltage is applied between the gate electrode 50 and the source electrode 30 with the gate electrode 50 side as a high potential and a determined voltage is applied between the drain electrode 40 and the source electrode 30 with the drain electrode 40 side as a high potential. It is assumed that the semiconductor device 1A is used as a semiconductor device capable of a high output and high-voltage operation. Accordingly, a comparatively high voltage is applied to the drain electrode 40. For example, a high voltage of 30 to 50 volts is applied to the drain electrode 40. The semiconductor layer 20 generates heat as a result of the operation of the semiconductor device 1A. When a comparatively high voltage is applied to the drain electrode 40 in the semiconductor device 1A, much heat is generated by the drain electrode 40 because an electric field applied to the drain electrode 40 is stronger than an electric field applied to the source electrode 30. Heat generated at an edge (referred to as a "drain side gate edge") 50a of the gate electrode 50 on the drain electrode 40 side at which electric field concentration occurs is apt to become significant.

As illustrated in FIG. 2, with the semiconductor device 1A the diamond layer 80 having high thermal conductivity is located between the gate electrode 50 and the drain electrode 40 so as to be in contact with the surface 20a of the semiconductor layer 20. As a result, with the semiconductor device 1A heat generated on the drain electrode 40 side of the gate electrode 50 including the drain side gate edge 50a is efficiently transferred to the diamond layer 80 and is dissipated. This will be described by reference to FIGS. 3 and 4.

Figure 3:
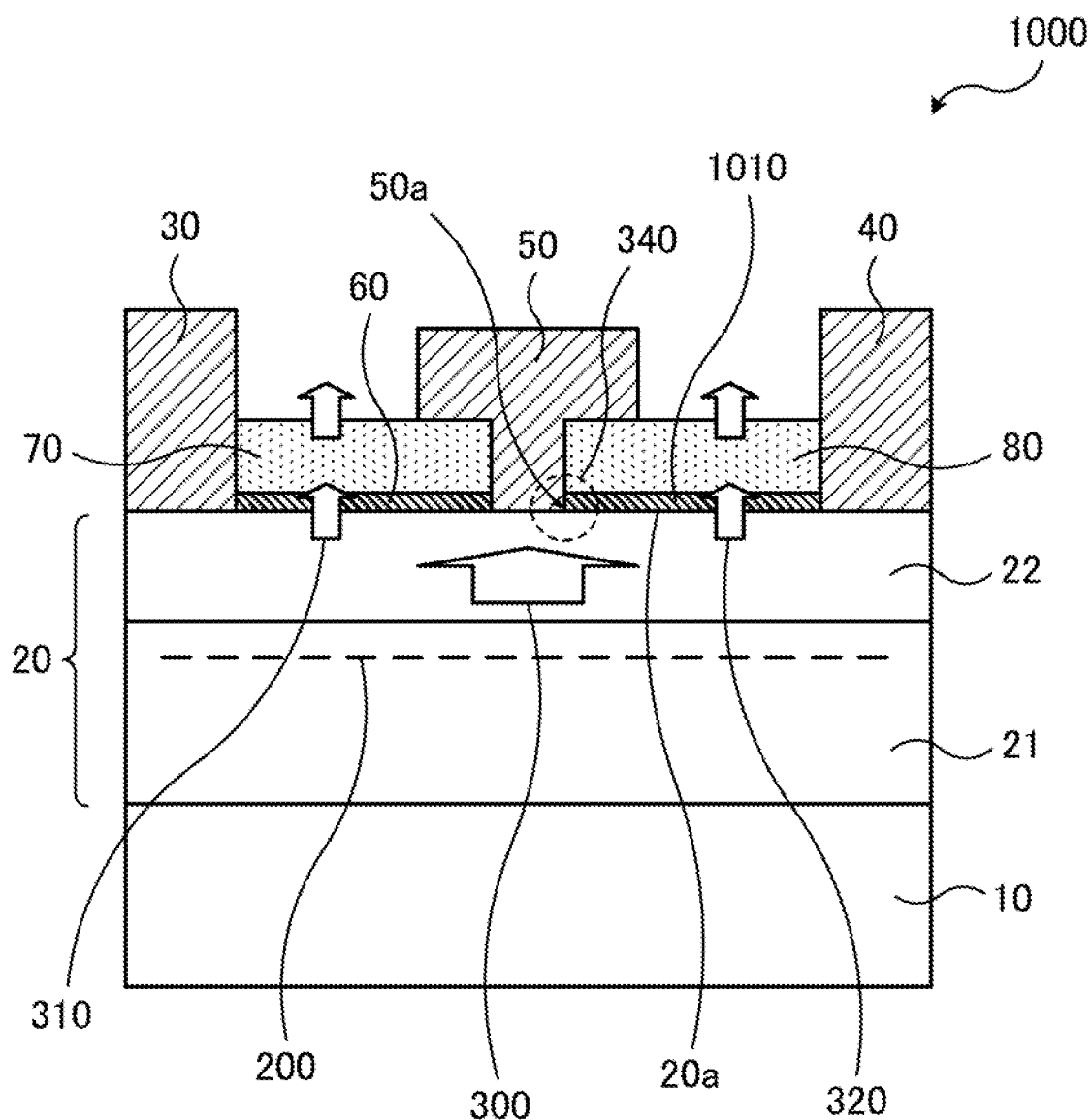
FIG. 3 is a view for describing heat transfer in a semiconductor device taken as a comparative example.
Figure 4:
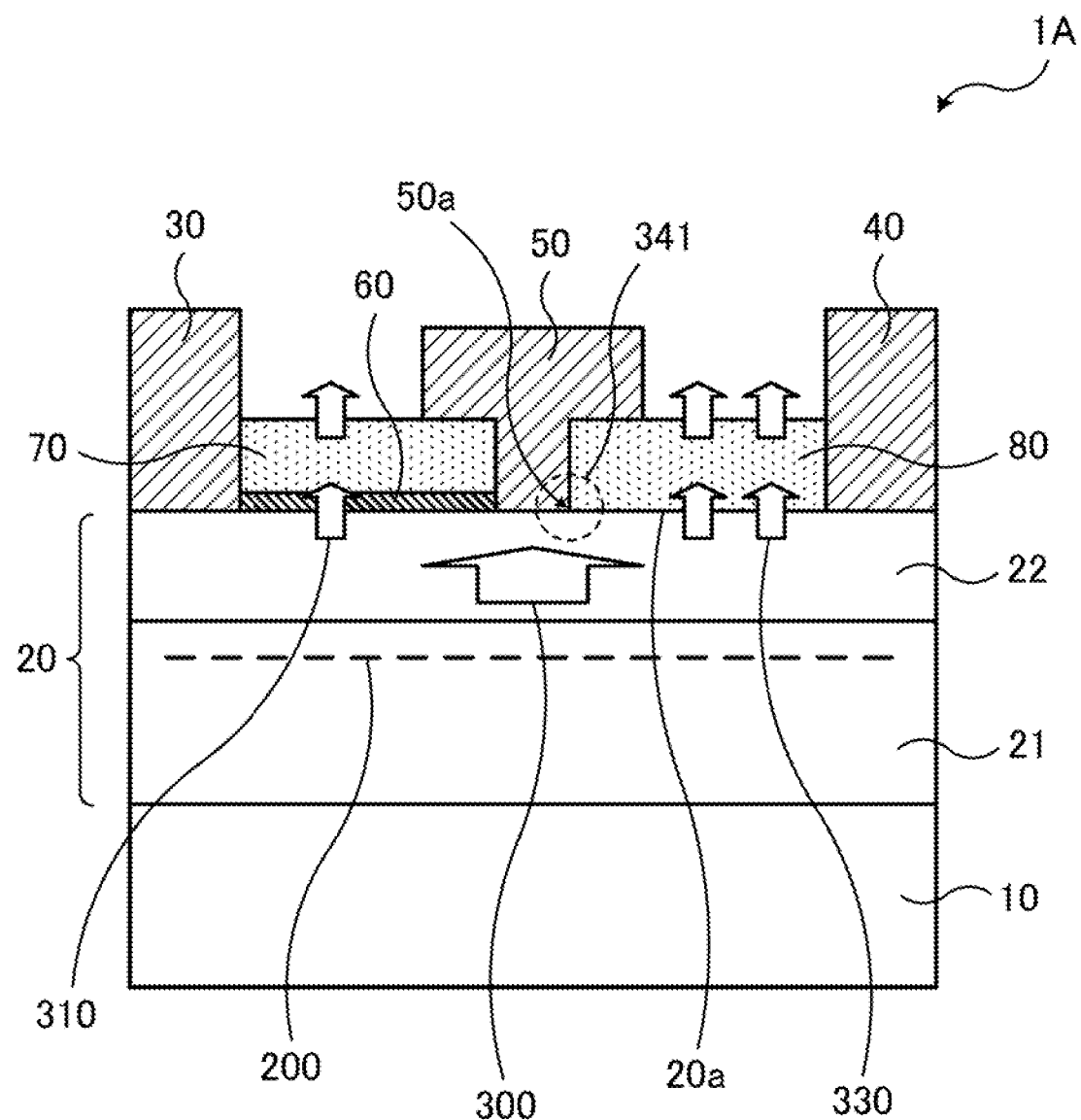
FIG. 4 is a view for describing heat transfer in the semiconductor device according to the second embodiment.

FIG. 3 is a view for describing heat transfer in a semiconductor device taken as a comparative example. FIG. 4 is a view for describing heat transfer in the semiconductor device according to the second embodiment. Each of FIGS. 3 and 4 is a fragmentary schematic sectional view of an example of a semiconductor device.

A semiconductor device 1000 illustrated in FIG. 3 has a structure in which a diamond layer 80 is located between a gate electrode 50 and a drain electrode 40 over a surface 20a of a semiconductor layer 20 with an insulating film 1010 therebetween. The semiconductor device 1000 differs from the above semiconductor device 1A (FIG. 2 and FIG. 4) in this respect. The same kind of insulating material that is used for forming an insulating film 60 is used for forming the insulating film 1010. For example, SiN is used.

When the semiconductor device 1000 operates, a comparatively high voltage is applied to the drain electrode 40. The semiconductor layer 20 generates heat as a result of the operation of the semiconductor device 1000. Partial heat 310, of heat 300 generated by the semiconductor layer 20, is transferred via the insulating film 60 between the gate electrode 50 and a source electrode 30 to a diamond layer 70 located thereover. Another partial heat 320, of the heat 300 generated by the semiconductor layer 20, is transferred via the insulating film 1010 between the gate electrode 50 and the drain electrode 40 to the diamond layer 80 located thereover. The diamond layer 70 transfers and dissipates the heat to the outside. The diamond layer 80 transfers and dissipates the heat to the outside. As a result, heat generated by the semiconductor layer 20 is dissipated or the semiconductor layer 20 is cooled.

However, with the semiconductor device 1000 the diamond layer 80 is located over the surface 20a of the semiconductor layer 20 with the insulating film 1010 having comparatively low thermal conductivity therebetween on the drain electrode 40 side of the gate electrode 50 where comparatively much heat is generated. Accordingly, heat transfer from the semiconductor layer 20 to the diamond layer 80 is suppressed by the insulating film 1010 and it may be that heat generated by the semiconductor layer 20 is not sufficiently dissipated. Furthermore, with the semiconductor device 1000, as indicated in a dashed circle 340 of FIG. 3, a drain side gate edge 50a which is apt to generate significantly much heat is in contact not with the diamond layer 80 but with the insulating film 1010. As a result, heat transfer from the drain side gate edge 50a to the diamond layer 80 is suppressed by the insulating film 1010 and it may be that heat generated by the semiconductor layer 20 is not sufficiently dissipated. If heat generated by the semiconductor layer 20 is not sufficiently dissipated, then the temperature of the semiconductor layer 20 rises and the semiconductor device 1000 overheats. This increases the possibility of a failure or degradation of the characteristics of the transistor.

On the other hand, with the semiconductor device 1A according to the second embodiment, as illustrated in FIG. 4, the diamond layer 80 is located directly on the surface 20a of the semiconductor layer 20 between the gate electrode 50 and the drain electrode 40.

When the semiconductor device 1A operates, a comparatively high voltage is applied to the drain electrode 40 and the semiconductor layer 20 generates heat as a result of the operation of the semiconductor device 1A. Partial heat 310, of heat 300 generated by the semiconductor layer 20, is transferred via the insulating film 60 between the gate electrode 50 and the source electrode 30 to the diamond layer 70 located thereover. Another partial heat 330, of the heat 300 generated by the semiconductor layer 20, is transferred directly to the diamond layer 80 between the gate electrode 50 and the drain electrode 40. The diamond layer 70 transfers the heat transferred to the diamond layer 70 and dissipates it to the outside. The diamond layer 80 transfers the heat transferred to the diamond layer 80 and dissipates it to the outside. As a result, heat generated by the semiconductor layer 20 is dissipated or the semiconductor layer 20 is cooled.

With the semiconductor device 1A the diamond layer 80 is located directly on the surface 20a of the semiconductor layer 20 on the drain electrode 40 side of the gate electrode 50 where comparatively much heat is generated. Accordingly, with the semiconductor device 1A heat generated by the semiconductor layer 20 is efficiently transferred from the semiconductor layer 20 to the diamond layer 80. Furthermore, with the semiconductor device 1A, as indicated in a dashed circle 341 of FIG. 4, the drain side gate edge 50a which is apt to generate significantly much heat is in contact not with the above insulating film 1010 but with the diamond layer 80. As a result, heat generated by the drain side gate edge 50a is efficiently transferred from the drain side gate edge 50a to the diamond layer 80.

With the semiconductor device 1A heat generated by the semiconductor layer 20 as a result of its operation is efficiently transferred to the diamond layer 80 and is efficiently dissipated via the diamond layer 80. This suppresses a rise in the temperature of the semiconductor layer 20. As a result, an overheat of the semiconductor device 1A or a failure or degradation of the characteristics of the transistor caused by it is effectively suppressed.

The heat generated by the semiconductor layer 20 may be transferred not only to the diamond layer 70 and the diamond layer 80 but also to other components such as the gate electrode 50, the source electrode 30, the drain electrode 40, and the substrate 10. Furthermore, heat transferred to the other components may be dissipated from the other components or may be transferred further from the other components to still other components and be dissipated.

Usually a voltage applied between the gate electrode 50 and the source electrode 30 is lower than a voltage applied between the gate electrode 50 and the drain electrode 40. As a result, heat generated between the gate electrode 50 and the source electrode 30 is less than heat generated between the gate electrode 50 and the drain electrode 40 or heat generated at the drain side gate edge 50a. Accordingly, as illustrated in FIG. 2 and FIG. 4, the diamond layer 70 is located between the gate electrode 50 and the source electrode 30 over the surface 20a of the semiconductor layer 20 with the insulating film 60 therebetween. The surface 20a of the semiconductor layer 20 is effectively protected by locating the insulating film 60 between the gate electrode 50 and the source electrode 30. Heat transferred from the semiconductor layer 20 via the insulating film 60 or heat transferred from the semiconductor layer 20 via the gate electrode 50 or the source electrode 30 is efficiently dissipated by the diamond layer 70 located over the insulating film 60.

FIGS. 5A and 5B are views for describing an example of a planar layout of the insulating film of the semiconductor device according to the second embodiment. Each of FIGS. 5A and 5B is a fragmentary schematic plan view of an example of a semiconductor device. FIG. 2 is a sectional view corresponding to the position of the line IIa-IIa of FIG. 5A or the line IIb-IIb of FIG. 5B. For convenience, the above diamond layer 70 or the above diamond layer 80 is not illustrated in FIGS. 5A and 5B.

With the semiconductor device 1A, as illustrated in, for example, FIG. 5A, the insulating film 60 which covers the whole of the surface 20a of the semiconductor layer 20 between the gate electrode 50 and the source electrode 30 is located. Such an insulating film 60 is not located over the surface 20a of the semiconductor layer 20 between the gate electrode 50 and the drain electrode 40.

Furthermore, with the semiconductor device 1A, as illustrated in, for example, FIG. 5B, the insulating film 60 is located between the gate electrode 50 and the source electrode 30 and an insulating film 60B which partially covers the surface 20a of the semiconductor layer 20 may be located between the gate electrode 50 and the drain electrode 40. For example, an insulating film 60B having one or more openings 60Ba leading to the surface 20a between the gate electrode 50 and the drain electrode 40 is located. In this example, an insulating film 60B having three openings 60Ba is located. The insulating film 60B is formed by the use of an insulating material such as SiN. This is the same with the insulating film 60.

As illustrated in FIG. 5B, the surface 20a of the semiconductor layer 20 is also partially covered with the insulating film 60B between the gate electrode 50 and the drain electrode 40. By doing so, the semiconductor layer 20 is protected. The diamond layer 80 (FIG. 2) is located directly on an area not covered with the insulating film 60B, of the surface 20a of the semiconductor layer 20 between the gate electrode 50 and the drain electrode 40, that is to say, on an area corresponding to the openings 60Ba. As a result, efficient heat transfer is performed from the semiconductor layer 20 to the diamond layer 80.

As long as at least part of the diamond layer 80 located over the surface 20a is in contact with the surface 20a via the openings 60Ba, the shape of the insulating film 60B (or the openings 60Ba) located between the gate electrode 50 and the drain electrode 40 is not limited to that illustrated in FIG. 5B.

Third Embodiment

Figure 6:
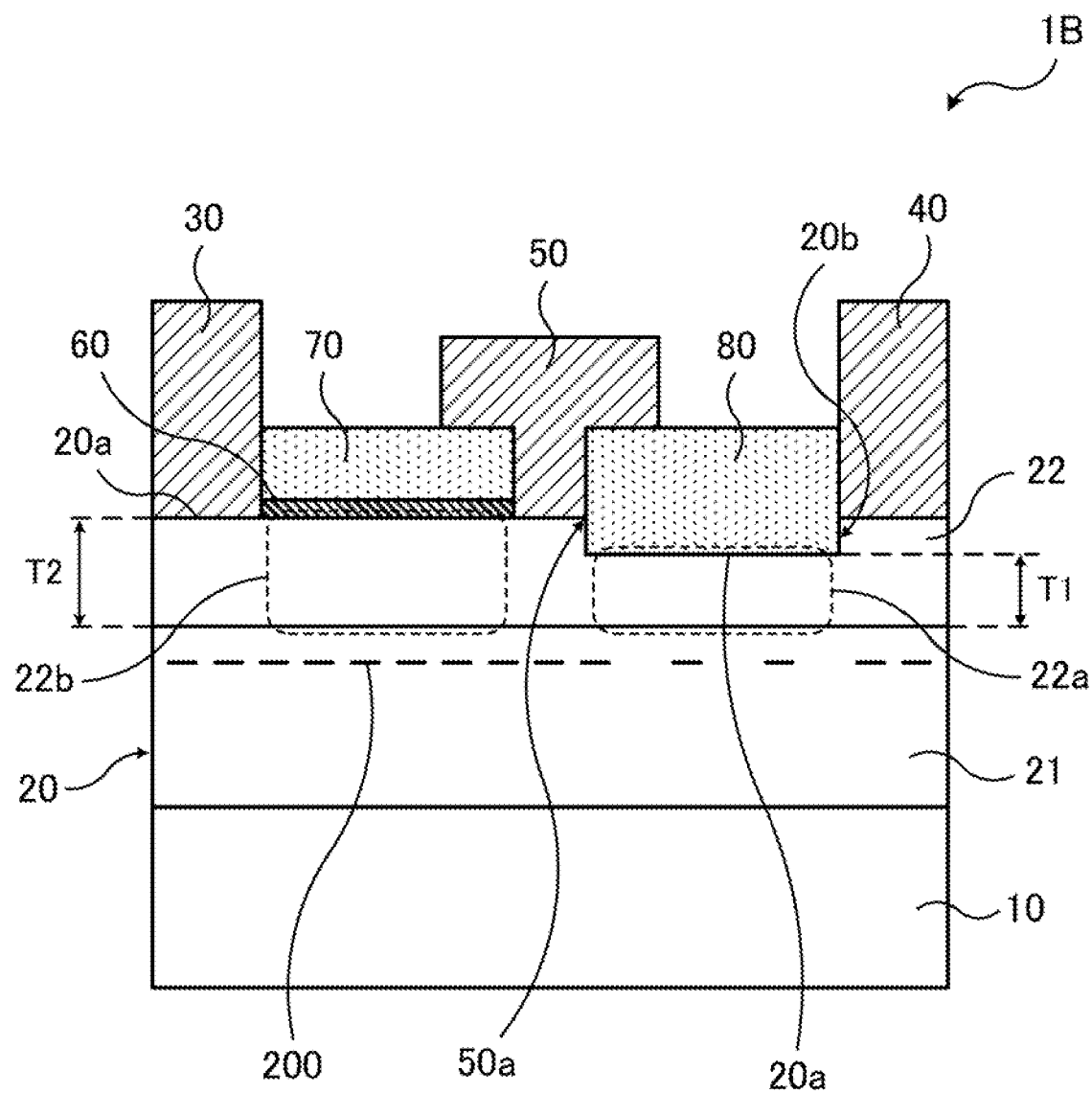
FIG. 6 is a view for describing a first example of a semiconductor device according to a third embodiment.

FIG. 6 is a view for describing a first example of a semiconductor device according to a third embodiment. FIG. 6 is a fragmentary schematic sectional view of an example of a semiconductor device.

With a semiconductor device 1B illustrated in FIG. 6, a surface 20a of a semiconductor layer 20 includes a concave portion 20b formed in an area of an electron supply layer 22 between a gate electrode 50 and a drain electrode 40 and a diamond layer 80 is located in the concave portion 20b. The semiconductor device 1B differs from the semiconductor device 1A according to the above second embodiment in this respect. The surface 20a of the semiconductor layer 20 includes the inside of the concave portion 20b formed in the electron supply layer 22.

With the semiconductor device 1B the diamond layer 80 is located in the concave portion 20b formed in the electron supply layer 22 so as to be in contact with the inside of the concave portion 20b. As a result, heat generated by the semiconductor layer 20 is efficiently transferred from the semiconductor layer 20 to the diamond layer 80. This is the same with the above semiconductor device 1A.

With the semiconductor device 1B in which the diamond layer 80 is located in the concave portion 20b, the diamond layer 80 is in contact with the inside of the concave portion 20b. This increases contact area between the diamond layer 80 and the semiconductor layer 20. As a result, heat is transferred more efficiently from the semiconductor layer 20 to the diamond layer 80. Furthermore, with the semiconductor device 1B a drain side gate edge 50a of the gate electrode 50 is in contact with a side of the diamond layer 80. As a result, contact between the drain side gate edge 50a and the diamond layer 80 is easily realized and efficient heat transfer from the drain side gate edge 50a to the diamond layer 80 is easily realized.

According to the semiconductor device 1B, an overheat of the semiconductor device 1B or a failure or degradation of the characteristics of the transistor caused by it is effectively suppressed.

In addition, with the semiconductor device 1B the concave portion 20b is formed in the electron supply layer 22. As a result, a portion 22a of the electron supply layer 22 between the gate electrode 50 and the drain electrode 40 is thinner than another portion of the electron supply layer 22. As illustrated in FIG. 6, for example, a thickness T1 of the portion 22a of the electron supply layer 22 between the gate electrode 50 and the drain electrode 40 is smaller than a thickness T2 of a portion 22b of the electron supply layer 22 between the gate electrode 50 and the source electrode 30. As a result, polarization in the portion 22a of the electron supply layer 22 on the drain electrode 40 side is weaker than polarization in another portion, such as the portion 22b on the source electrode 30 side, of the electron supply layer 22.

The concave portion 20b is formed in the electron supply layer 22, the portion 22a of the electron supply layer 22 on the drain electrode 40 side is made thin, and polarization in the portion 22a is weakened. By doing so, the concentration of a 2DEG 200 generated in an electron transit layer 21 bonded to the portion 22a is lowered. That is to say, with the semiconductor device 1B the concentration of the 2DEG 200 generated on the drain electrode 40 side is lower than that of the 2DEG 200 generated on the source electrode 30 side. In other words, a carrier modulation effect is obtained. The semiconductor device 1B having a high breakdown voltage is realized by lowering in this way the concentration of the 2DEG 200 on the drain electrode 40 side.

For example, the depth of the concave portion 20b formed in the electron supply layer 22 is set to a value smaller than or equal to half of the thickness of the electron supply layer 22. If the depth of the concave portion 20b is set to a value greater than half of the thickness of the electron supply layer 22, then polarization is excessively weakened and it may be that the 2DEG 200 which functions as a carrier is not obtained. The depth of the concave portion 20b is set within half of the thickness of the electron supply layer 22 on the basis of the degree of a target low concentration of the 2DEG 200 and the like.

Figure 7:
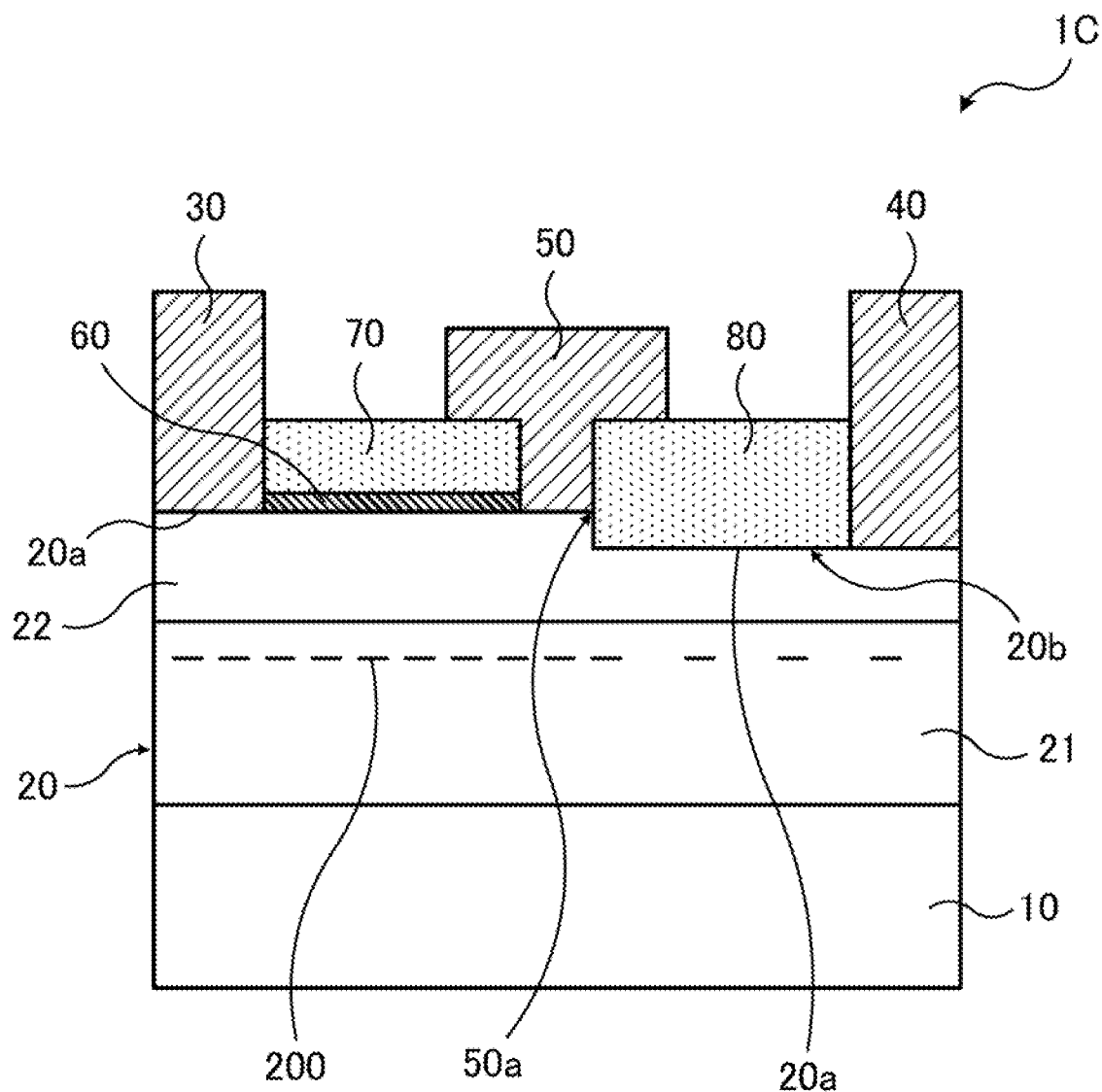
FIG. 7 is a view for describing a second example of the semiconductor device according to the third embodiment.

Furthermore, FIG. 7 is a view for describing a second example of the semiconductor device according to the third embodiment. FIG. 7 is a fragmentary schematic sectional view of an example of a semiconductor device.

With a semiconductor device 1C illustrated in FIG. 7, a diamond layer 80 and a drain electrode 40 are located in a concave portion 20b formed in an electron supply layer 22. The semiconductor device 1C differs from the above semiconductor device 1B illustrated in FIG. 6 in this respect.

As with the semiconductor device 1C, the concave portion 20b may be formed in an area of the electron supply layer 22 between a gate electrode 50 and the drain electrode 40 and in an area of the electron supply layer 22 corresponding to the drain electrode 40. With the semiconductor device 1C the same effect that is obtained by the above semiconductor device 1B is achieved.

Furthermore, with the semiconductor device 1C the diamond layer 80 and the drain electrode 40 are located in the concave portion 20b. As a result, a side of the diamond layer 80 on the drain electrode 40 side is wholly in contact with the drain electrode 40. That is to say, with the semiconductor device 1C not only contact area between the diamond layer 80 and a semiconductor layer 20 but also contact area between the diamond layer 80 and the drain electrode 40 increases. As a result, with the semiconductor device 1C efficient heat transfer between the diamond layer 80 and the semiconductor layer 20 and efficient heat transfer between the diamond layer 80 and the drain electrode 40 are realized.

Fourth Embodiment

Figure 8:
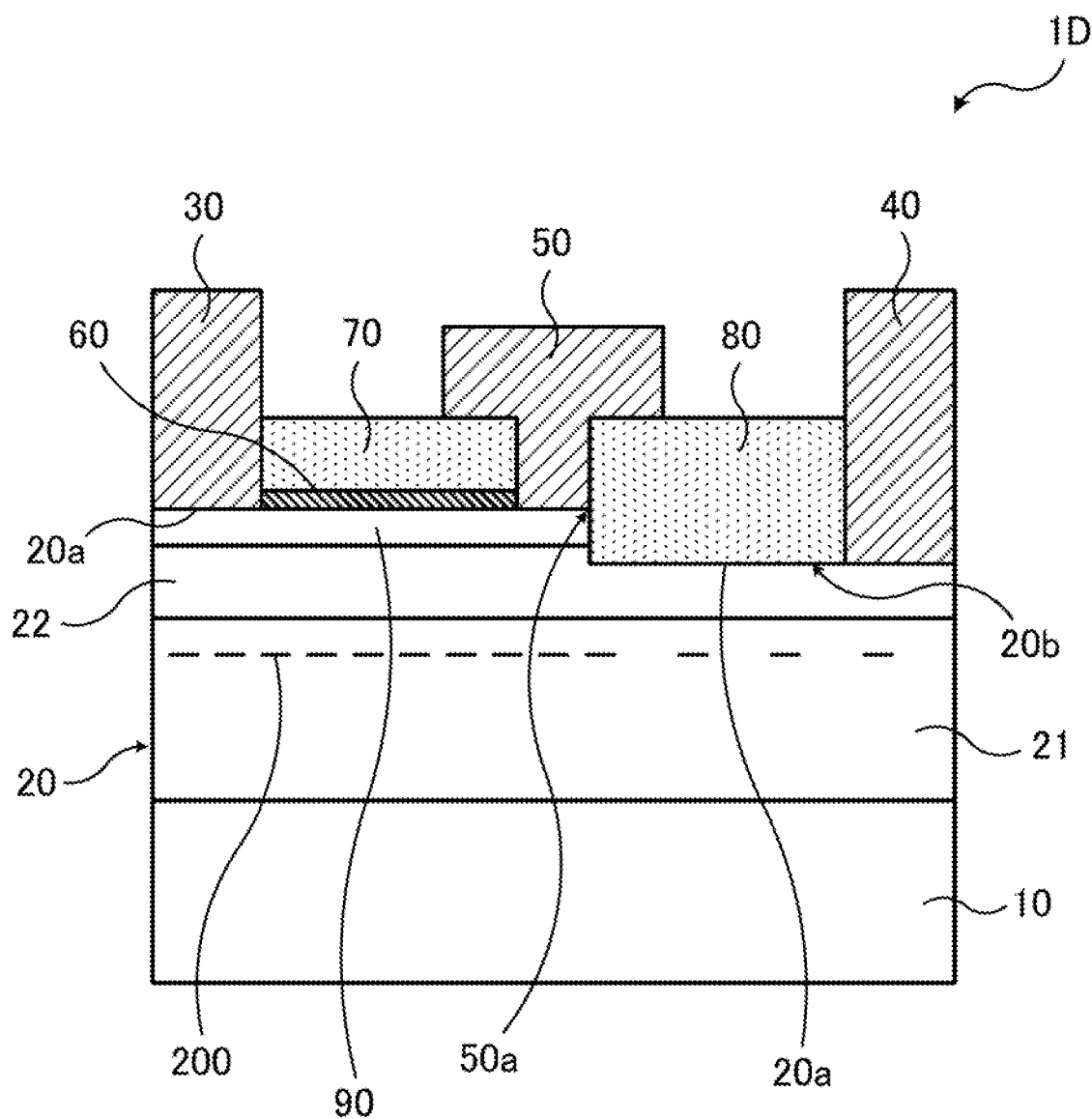
FIG. 8 is a view for describing an example of a semiconductor device according to a fourth embodiment.

FIG. 8 is a view for describing an example of a semiconductor device according to a fourth embodiment. FIG. 8 is a fragmentary schematic sectional view of an example of a semiconductor device.

With a semiconductor device 1D illustrated in FIG. 8, a cap layer 90 is located over an electron supply layer 22 of a semiconductor layer 20. The semiconductor device 1D differs from the above semiconductor device 1C according to the third embodiment (FIG. 7) in this respect.

The cap layer 90 is formed by the use of a nitride semiconductor such as n-type GaN. The cap layer 90 has the function of protecting the electron supply layer 22. If the cap layer 90 is located over the electron supply layer 22 as with the semiconductor device 1D, then the depth of a concave portion 20b to be formed is set so as to pierce the cap layer 90 and reach the inside of the electron supply layer 22. By doing so, a portion of the electron supply layer 22 on the drain electrode 40 side is made thinner than another portion of the electron supply layer 22, the concentration of a 2DEG 200 generated on the drain electrode 40 side of an electron transit layer 21 is lowered, and the semiconductor device 1D having a high breakdown voltage is realized.

A semiconductor device obtained by locating the cap layer 90 in the semiconductor layer 20 of the above semiconductor device 1C according to the third embodiment (FIG. 7) is taken as the semiconductor device 1D. However, the cap layer 90 may be located in the same way in the semiconductor layer 20 of the above semiconductor device 1A according to the second embodiment (FIG. 2) or in the semiconductor layer 20 of the above semiconductor device 1B according to the third embodiment (FIG. 6).

A p-type GaN layer or an InGaN layer may be located as a cap layer used in a HEMT so as to be specifically situated just under a gate electrode 50. If a p-type GaN layer is located just under the gate electrode 50, then a conduction band at the junction interface between the electron transit layer 21 and the electron supply layer 22 under the gate electrode 50 is pushed up by a fixed charge of the p-type GaN layer and the generation of the 2DEG 200 is suppressed. If an InGaN layer is located just under the gate electrode 50, then a conduction band at the junction interface between the electron transit layer 21 and the electron supply layer 22 under the gate electrode 50 is pushed up by piezo polarization generated in the InGaN layer and the generation of the 2DEG 200 is suppressed. By locating a p-type GaN layer or an InGaN layer just under the gate electrode 50, a current flowing between a source electrode 30 and the drain electrode 40 is shut off when a gate voltage is off. That is to say, what is call a normally-off HEMT is realized.

Fifth Embodiment

Figure 9:
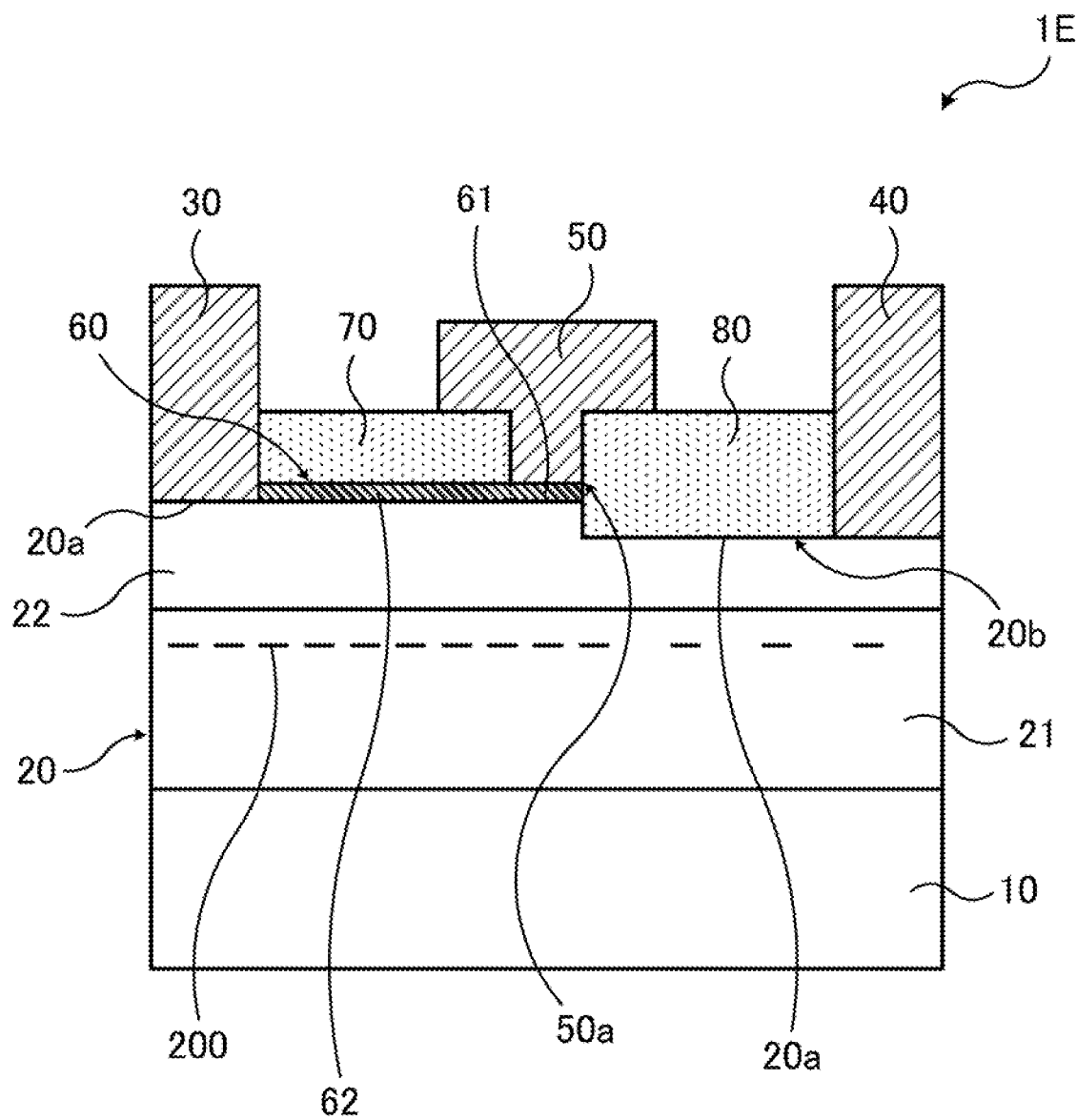
FIG. 9 is a view for describing an example of a semiconductor device according to a fifth embodiment.

FIG. 9 is a view for describing an example of a semiconductor device according to a fifth embodiment. FIG. 9 is a fragmentary schematic sectional view of an example of a semiconductor device.

With a semiconductor device 1E illustrated in FIG. 9, an insulating film 60 formed over a surface 20a of a semiconductor layer 20 lies between a gate electrode 50 and a source electrode 30 and just under the gate electrode 50. The semiconductor device 1E differs from the above semiconductor device 1C according to the third embodiment (FIG. 7) in this respect.

With the semiconductor device 1E part of the insulating film 60 intervenes as a gate insulating film 61 between the gate electrode 50 and the surface 20a of the semiconductor layer 20. That is to say, the semiconductor device 1E is an example of a metal insulator semiconductor (MIS)-type HEMT. With the semiconductor device 1E the gate insulating film 61 intervenes between the gate electrode 50 and the semiconductor layer 20. As a result, the generation of a leakage current between the gate electrode 50 and the semiconductor layer 20 is suppressed compared with a case where a Schottky connection of the gate electrode 50 with the semiconductor layer 20 is formed. Furthermore, with the semiconductor device 1E the gate insulating film 61 intervenes between the gate electrode 50 and the semiconductor layer 20. This prevents metal components contained in the gate electrode 50 from diffusing by heating into the semiconductor layer 20. As a result, the heat resistance of the gate electrode 50 is improved and a drop in gate forward rising voltage caused by the diffusion of the metal components into the semiconductor layer 20 is suppressed.

In this example, the insulating film 60 located as a foundation of a diamond layer 70 between the gate electrode 50 and the source electrode 30 is extended so as to lie just under the gate electrode 50, and part of the extended insulating film 60 is used as the gate insulating film 61. That is to say, with the semiconductor device 1E a foundation insulating film 62 located just under the diamond layer 70 between the gate electrode 50 and the source electrode 30 and the gate insulating film 61 located just under the gate electrode 50 are integrally formed as the insulating film 60.

Furthermore, the foundation insulating film 62 located just under the diamond layer 70 between the gate electrode 50 and the source electrode 30 and the gate insulating film 61 located just under the gate electrode 50 may separately be formed. In this case, the foundation insulating film 62 and the gate insulating film 61 may be formed by the use of the same kind of insulating material or different kinds of insulating materials. In addition, each of the foundation insulating film 62 and the gate insulating film 61 may have a single-layer structure of one kind of insulating material or a laminated structure of the same kind of insulating material or different kinds of insulating materials.

In this example, a semiconductor device obtained by forming the foundation insulating film 62 and the gate insulating film 61 in the above semiconductor device 1C according to the third embodiment (FIG. 7) is taken as the semiconductor device 1E. However, the foundation insulating film 62 and the gate insulating film 61 may be formed in the same way in the above semiconductor device 1A according to the second embodiment (FIG. 2), the above semiconductor device 1B according to the third embodiment (FIG. 6), or the above semiconductor device 1D according to the fourth embodiment (FIG. 8).

Sixth Embodiment

Figure 10:
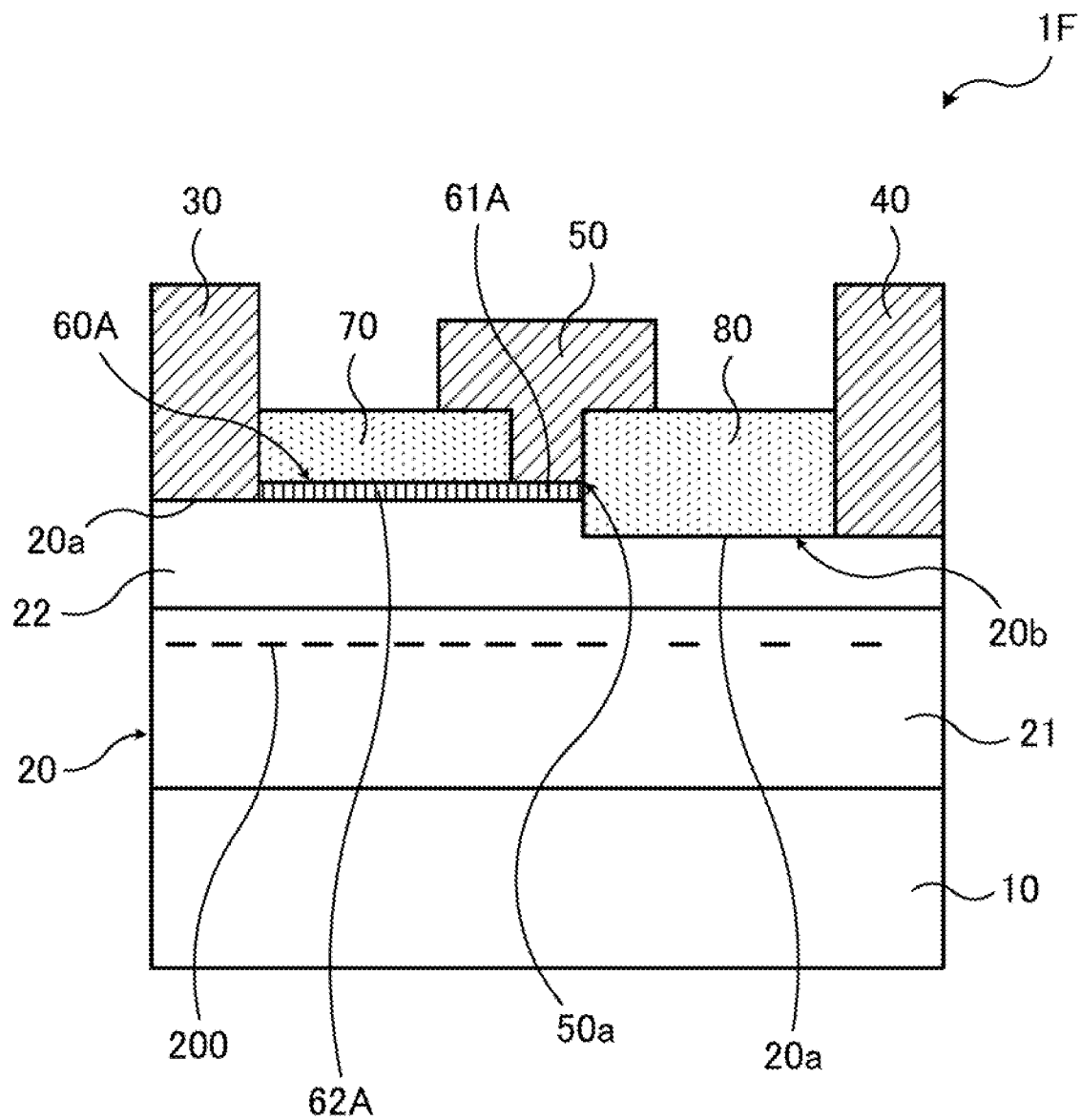
FIG. 10 is a view for describing an example of a semiconductor device according to a sixth embodiment.

FIG. 10 is a view for describing an example of a semiconductor device according to a sixth embodiment. FIG. 10 is a fragmentary schematic sectional view of an example of a semiconductor device.

With a semiconductor device 1F illustrated in FIG. 10, an insulating film 60A is formed by the use of an insulating material which differs from an insulating material used for forming the above insulating film 60 (foundation insulating film 62 and the gate insulating film 61) in band gap. The semiconductor device 1F differs from the above semiconductor device 1E according to the fifth embodiment (FIG. 9) in this respect.

The insulating film 60A includes a foundation insulating film 62A located just under a diamond layer 70 between a gate electrode 50 and a source electrode 30 and a gate insulating film 61A located just under the gate electrode 50. An insulating material, such as $Al_2O_3$, is used for forming the insulating film 60A. Alternatively, an insulating material, such as $SiO_2$, SiON, or AlON, may be used for forming the insulating film 60A.

The same effect that is obtained by the above semiconductor device 1E is achieved by the semiconductor device 1F in which the insulating film 60A is formed. That is to say, for example, the generation of a leakage current between the gate electrode 50 and a semiconductor layer 20 is suppressed, the heat resistance of the gate electrode 50 is improved, and a drop in gate forward rising voltage is suppressed.

With the semiconductor device 1F the band gap of an insulating material, such as $Al_2O_3$, used for forming the insulating film 60A is wider than that of SiN taken as an insulating material used for forming the above insulating film 60. Furthermore, the difference in band gap between an insulating material, such as $Al_2O_3$, used for forming the insulating film 60A and an electron supply layer 22 of the semiconductor layer 20 formed by the use of n-type AlGaN or the like becomes larger. The gate insulating film 61A having a high barrier property intervenes between the gate electrode 50 and the semiconductor layer 20 by using an insulating material, such as $Al_2O_3$, for forming the insulating film 60A. As a result, a voltage applied to the gate electrode 50 is increased and a high output semiconductor device 1F is realized.

In this example, the foundation insulating film 62A and the gate insulating film 61A are integrally formed as the insulating film 60A. However, the foundation insulating film 62A and the gate insulating film 61A may separately be formed. In this case, as long as an insulating material, such as $Al_2O_3$, having a comparatively wide band gap is used for forming the gate insulating film 61A, the same kind of insulating material or different kinds of insulating materials may be used for forming the foundation insulating film 62A and the gate insulating film 61A. Furthermore, as long as an insulating material, such as $Al_2O_3$, having a comparatively wide band gap is used for forming the gate insulating film 61A, each of the foundation insulating film 62A and the gate insulating film 61A may have a single-layer structure of one kind of insulating material or a laminated structure of the same kind of insulating material or different kinds of insulating materials.

An insulating material, such as $Al_2O_3$, in the sixth embodiment may be used for forming the insulating film 60 of the above semiconductor device 1A according to the second embodiment (FIG. 2), the above semiconductor device 1B according to the third embodiment (FIG. 6), the above semiconductor device 1C according to the third embodiment (FIG. 7), or the above semiconductor device 1D according to the fourth embodiment (FIG. 8).

Seventh Embodiment

Figure 11:
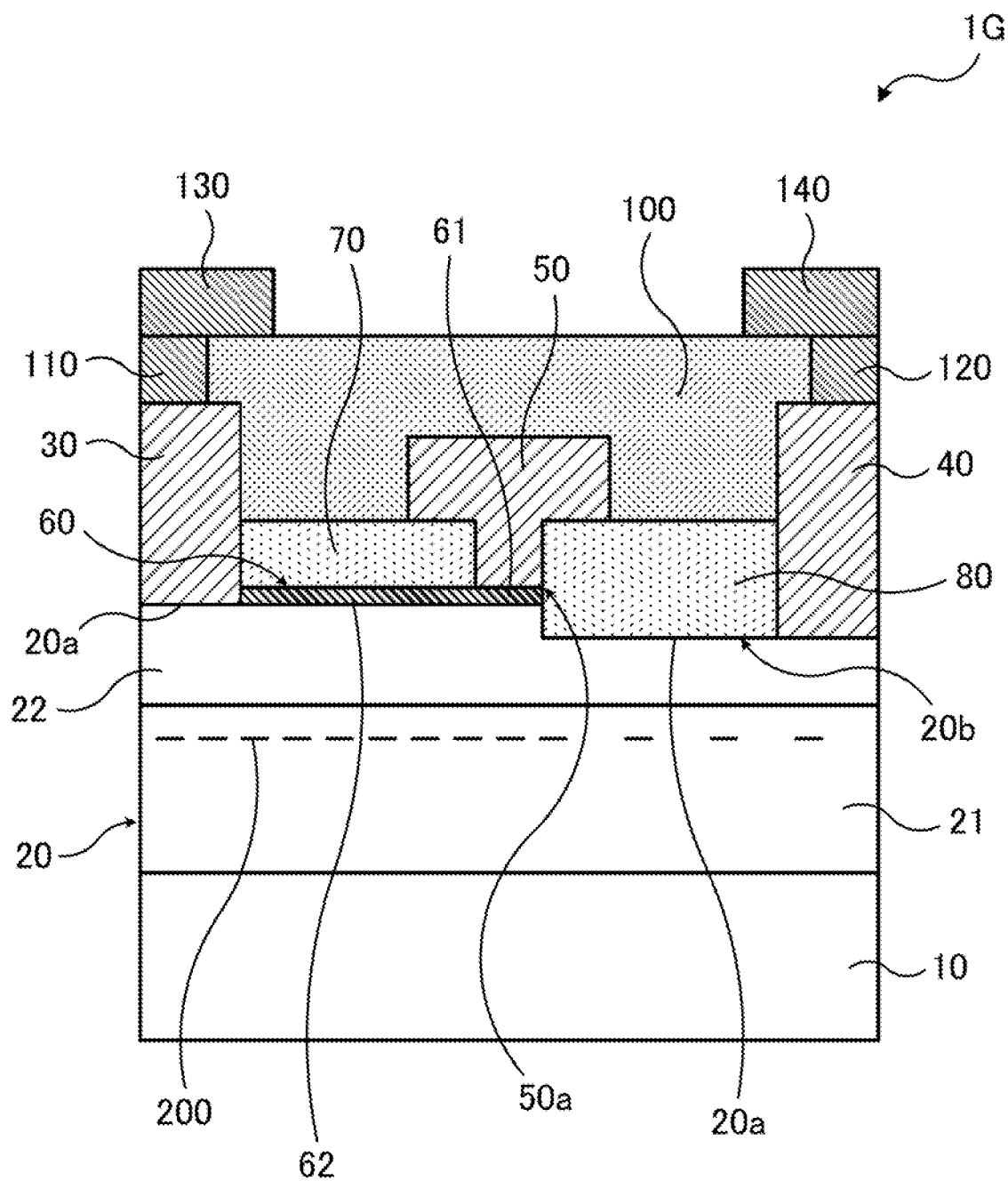
FIG. 11 is a view for describing a first example of a semiconductor device according to a seventh embodiment.

FIG. 11 is a view for describing a first example of a semiconductor device according to a seventh embodiment.

FIG. 11 is a fragmentary schematic sectional view of an example of a semiconductor device.

A semiconductor device 1G illustrated in FIG. 11 includes a diamond layer 100 located so as to cover a gate electrode 50, a diamond layer 70, a diamond layer 80, a source electrode 30, and a drain electrode 40. Furthermore, the semiconductor device 1G includes vias 110 and 120 formed so as to pierce the diamond layer 100 and reach the source electrode 30 and the drain electrode 40 respectively, and a wiring 130 and a wiring 140 formed over the diamond layer 100 so as to be connected to the vias 110 and 120 respectively. The semiconductor device 1G also includes a via (not illustrated) formed so as to pierce the diamond layer 100 and reach the gate electrode 50, and a wiring (not illustrated) formed over the diamond layer 100 so as to be connected to the via. The via 110, the via 120, and the like and the wiring 130, the wiring 140, and the like are formed by the use of various conductive materials such as copper (Cu) or Al.

The semiconductor device 1G differs from the above semiconductor device 1E according to the fifth embodiment (FIG. 9) in that it has the above structure.

When the semiconductor device 1G operates, a determined voltage is applied between the wiring connected via the via to the gate electrode 50 and the wiring 130 connected via the via 110 to the source electrode 30 with the gate electrode 50 side as a high potential. Furthermore, a determined voltage is applied between the wiring 130 connected via the via 110 to the source electrode 30 and the wiring 140 connected via the via 120 to the drain electrode 40 with the drain electrode 40 side as a high potential.

A semiconductor layer 20 generates heat as a result of the operation of the semiconductor device 1G. On the source electrode 30 side where an electric field generated by applying the voltage is comparatively weak and comparatively little heat is generated, heat generated by the semiconductor layer 20 is transferred via an insulating film 60 to the diamond layer 70. On the drain electrode 40 where an electric field generated by applying the voltage is comparatively strong and comparatively much heat is generated, heat generated by the semiconductor layer 20 is transferred directly to the diamond layer 80. Heat generated at a drain side gate edge 50a of the gate electrode 50 at which electric field concentration occurs is transferred from the drain side gate edge 50a to the diamond layer 80. The heat transferred to the diamond layer 70 and the diamond layer 80 is transferred further to the diamond layer 100 and is dissipated via the diamond layer 100.

As stated above, with the semiconductor device 1G the heat generated by the semiconductor layer 20 is transferred to the diamond layer 70 and the diamond layer 80 and is efficiently transferred further to the diamond layer 100. This suppresses a rise in the temperature of the semiconductor layer 20. As a result, an overheat of the semiconductor device 1G or a failure or degradation of the characteristics of the transistor caused by it is effectively suppressed.

The heat generated by the semiconductor layer 20 may be transferred not only to the diamond layer 70, the diamond layer 80, and the diamond layer 100 but also to other components such as the gate electrode 50, the source electrode 30, the drain electrode 40, and a substrate 10. Furthermore, heat transferred to the other components may be dissipated from the other components or may be transferred further from the other components to still other components and be dissipated.

Furthermore, the diamond layer 100, the via 110, the via 120, the wiring 130, the wiring 140, and the like in the seventh embodiment may be formed in the same way in the above semiconductor device 1A according to the second embodiment (FIG. 2), the above semiconductor device 1B according to the third embodiment (FIG. 6), the above semiconductor device 1C according to the third embodiment (FIG. 7), the above semiconductor device 1D according to the fourth embodiment (FIG. 8), or the above semiconductor device 1F according to the sixth embodiment (FIG. 10).

Figure 12:
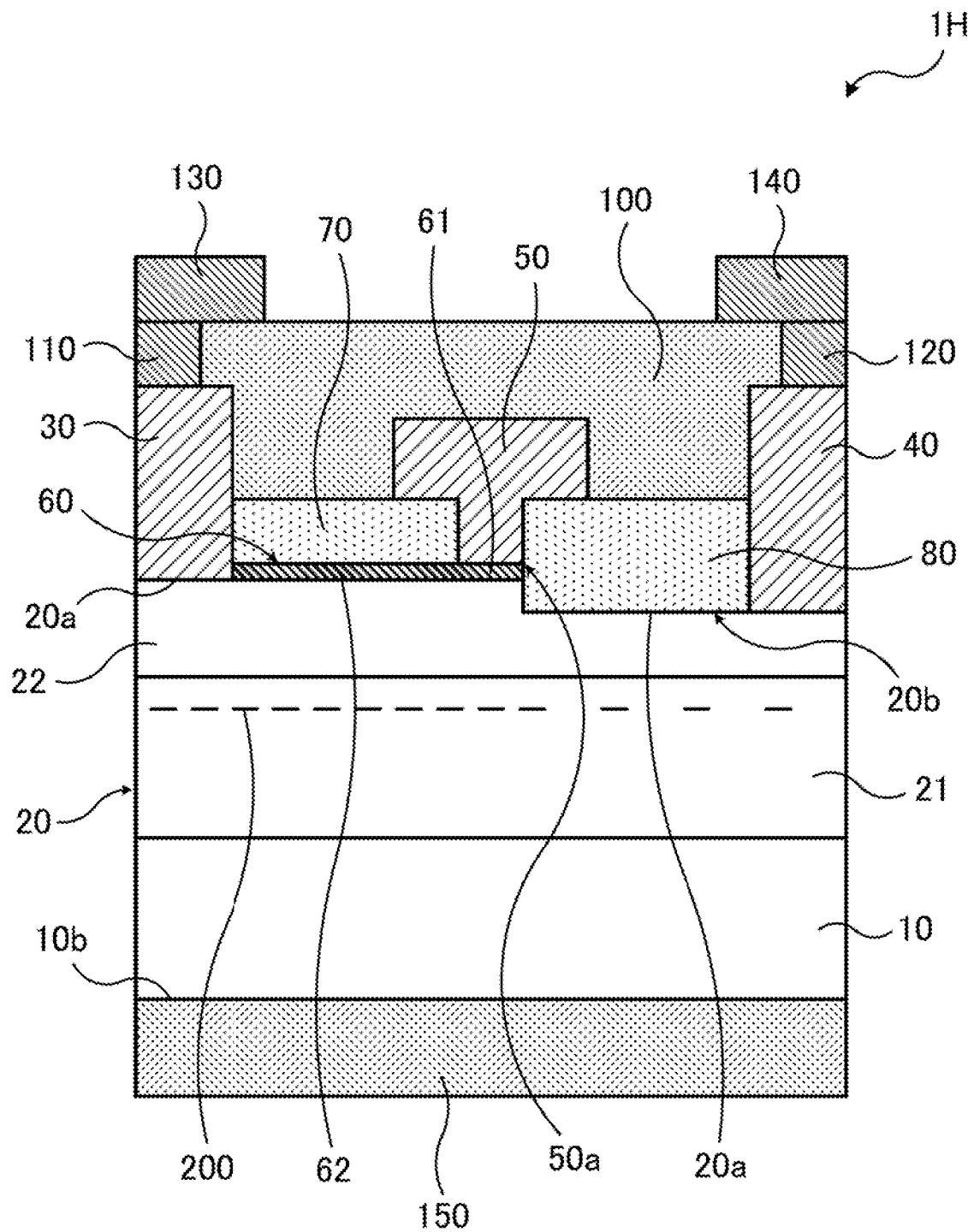
FIG. 12 is a view for describing a second example of the semiconductor device according to the seventh embodiment.

FIG. 12 is a view for describing a second example of the semiconductor device according to the seventh embodiment. FIG. 12 is a fragmentary schematic sectional view of an example of a semiconductor device.

With a semiconductor device 1H illustrated in FIG. 12, a diamond layer 150 is formed on a surface 10b opposite to a surface 20a of a semiconductor layer 20. To be more concrete, a diamond layer 150 is formed on a surface 10b of a substrate 10 opposite to a semiconductor layer 20. The semiconductor device 1H differs from the semiconductor device 1G described in the above first example (FIG. 11) in this respect.

With the semiconductor device 1H the diamond layer 150 is formed on the surface 10b of the substrate 10. Accordingly, heat generated by the semiconductor layer 20 as a result of the operation of the semiconductor device 1H and transferred to the substrate 10 is further transferred efficiently to the diamond layer 150 and is dissipated. This effectively suppresses a rise in the temperature of the semiconductor layer 20. As a result, an overheat of the semiconductor device 1H or a failure or degradation of the characteristics of the transistor caused by it is suppressed more effectively.

The diamond layer 150 in the seventh embodiment may be formed in the same way in the above semiconductor device 1A according to the second embodiment (FIG. 2), the above semiconductor device 1B according to the third embodiment (FIG. 6), the above semiconductor device 1C according to the third embodiment (FIG. 7), the above semiconductor device 1D according to the fourth embodiment (FIG. 8), the above semiconductor device 1E according to the fifth embodiment (FIG. 9), or the above semiconductor device 1F according to the sixth embodiment (FIG. 10).

Eighth Embodiment

An example of a method for fabricating a semiconductor device will now be described as an eighth embodiment.

Figure 13A:
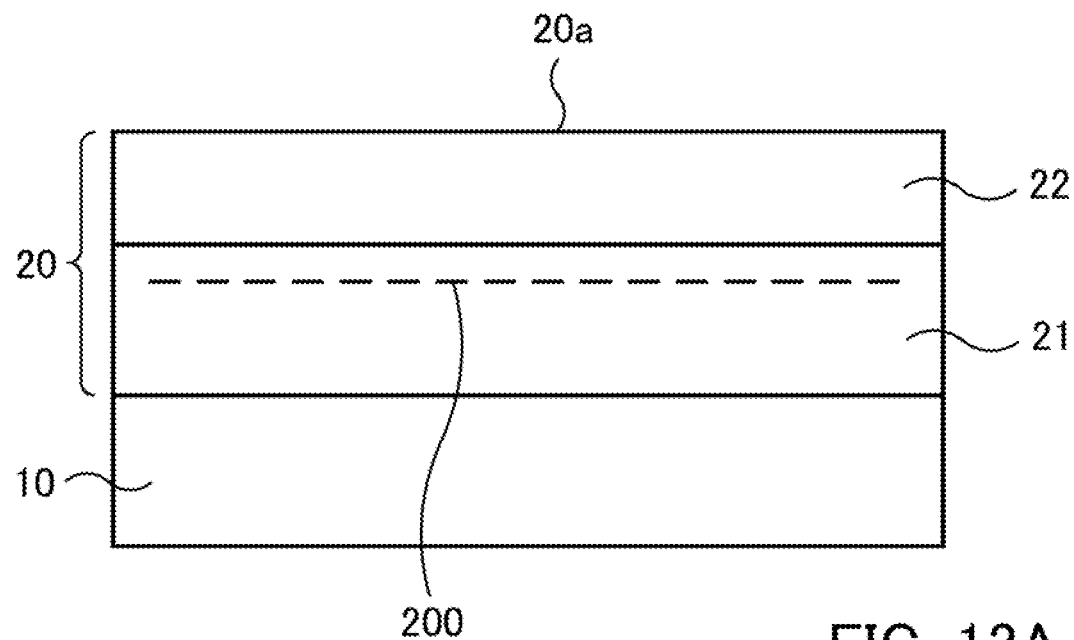
FIGS. 13A and 13B are views for describing an example of a method for fabricating a semiconductor device according to an eighth embodiment (part 1)

FIGS. 13A through 172 are views for describing an example of a method for fabricating a semiconductor device according to an eighth embodiment. Each of FIG. 13A, FIG. 13B, FIG. 14A, FIG. 14B, FIG. 15A, FIG. 15B, FIG. 16A, FIG. 16B, FIG. 17A, and FIG. 17B is a fragmentary schematic sectional view of a process for fabricating a semiconductor device.

As illustrated in FIG. 13A, first a semiconductor layer 20 is formed over a substrate 10. For example, an SiC substrate is used as the substrate 10. An electron transit layer 21 and an electron supply layer 22 of the semiconductor layer 20 are laminated over the substrate 10 by crystal growth by the use of the MOVPE method. For example, undoped GaN (i-type GaN) is crystal-grown as the electron transit layer 21 and n-type $Al_xGa_{1-x}N$ (0<x<1) is crystal-grown as the electron supply layer 22. For example, i-type GaN having a thickness of about 1 µm is crystal-grown as the electron transit layer 21 and n-type $Al_{0.2}Ga_{0.8}N$ (Al ingredient x is 0.2) having a thickness of 5 to 20 nm is crystal-grown as the electron supply layer 22.

Before the electron transit layer 21 is crystal-grown, AlN or the like may be crystal-grown over the substrate 10 as an initial layer or AlGaN or the like may be crystal-grown over the substrate 10 as a buffer layer. Furthermore, before the electron supply layer 22 is crystal-grown, a spacer layer may be formed over the electron transit layer 21 by the use of i-type AlGaN or the like. Moreover, a cap layer may be formed over the electron supply layer 22 by the use of n-type GaN or the like.

If each layer is crystal-grown by the use of the MOVPE method, then mixed gas of tri-methyl-gallium (TMGa), which serves as a gallium (Ga) source, and ammonia ($NH_3$) is used for crystal-growing GaN. Mixed gas of tri-methyl-aluminum (TMAl), which serves as an Al source, TMGa, which serves as a Ga source, and $NH_3$ is used for crystal-growing AlGaN. Mixed gas of TMAl, which serves as an Al source, and $NH_3$ is used for crystal-growing AlN. If a nitride semiconductor is doped with Si as n-type impurities, then silane ($SiH_4$) or the like is used as a Si source. The supply and stoppage (switching) of TMAl or TMGa and a flow rate at supply time (ratio of TMAl or TMGa to another material) are properly set according to a nitride semiconductor to be crystal-grown. The flow rate of $NH_3$ which is a common material of GaN and AlGaN (and AlN in the case of AlN being crystal-grown) is about 100 ml/m to 10 L/m. Crystal growth pressure is about 50 to 300 Torr (1 Torr is approximately equal to 133.322 Pa) and crystal growth temperature is about 1000 to 2000° C.

After each layer is crystal-grown, argon (Ar) ions are implanted from a surface 20a of the semiconductor layer 20 on the electron supply layer 22 side to perform isolation (not illustrated).

Figure 13B:
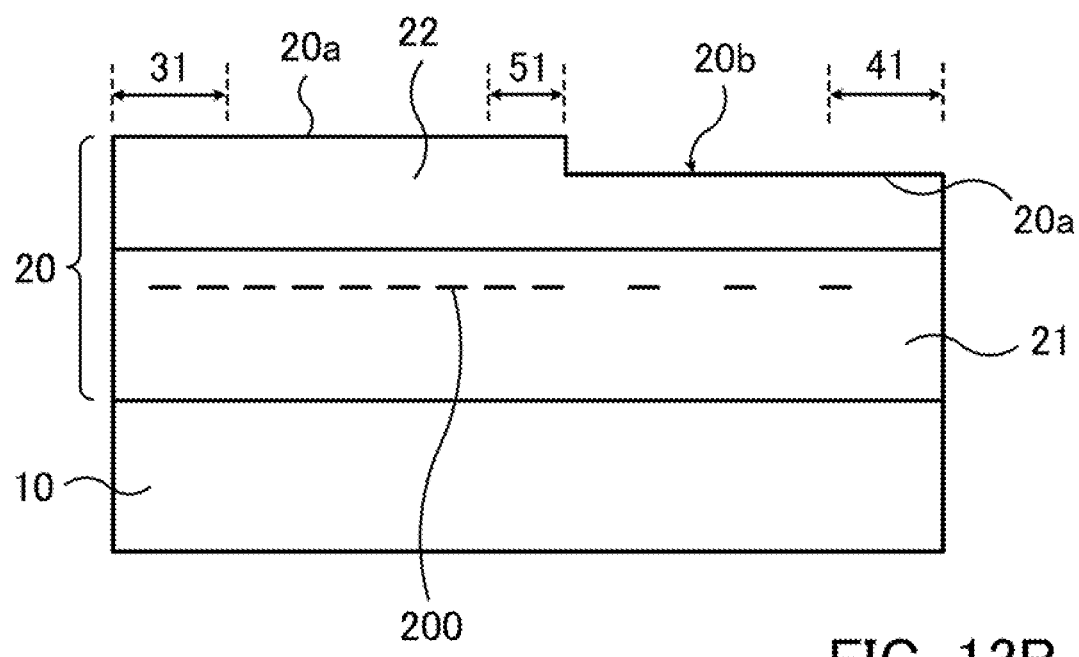

Next, as illustrated in FIG. 13B, a concave portion 20b is formed in a portion of the semiconductor layer 20 between a region 51 where a gate electrode 50 is to be formed (gate electrode formation scheduled region) and a region 41 where a drain electrode 40 is to be formed (drain electrode formation scheduled region) and in the drain electrode formation scheduled region 41 of the semiconductor layer 20. For example, first a resist film having an opening over the portion between the gate electrode formation scheduled region 51 and the drain electrode formation scheduled region 41 and over the drain electrode formation scheduled region 41 is formed over the semiconductor layer 20 by the use of a photolithography technique. Furthermore, the concave portion 20b having a determined depth is formed in the electron supply layer 22 of the semiconductor layer 20 exposed in the opening of the resist film by dry etching using chlorine-based gas.

The concave portion 20b is formed in the electron supply layer 22 of the semiconductor layer 20. By doing so, the surface 20a including the inside of the concave portion 20b is formed. Furthermore, because the concave portion 20b is formed in the electron supply layer 22 of the semiconductor layer 20, the electron supply layer 22 in the portion between the gate electrode formation scheduled region 51 and the drain electrode formation scheduled region 41 and the drain electrode formation scheduled region 41 becomes thinner than the electron supply layer 22 in the other region. This lowers the concentration of a 2DEG 200 generated in the electron transit layer 21 in the portion between the gate electrode formation scheduled region 51 and the drain electrode formation scheduled region 41 and the drain electrode formation scheduled region 41.

Figure 14A:
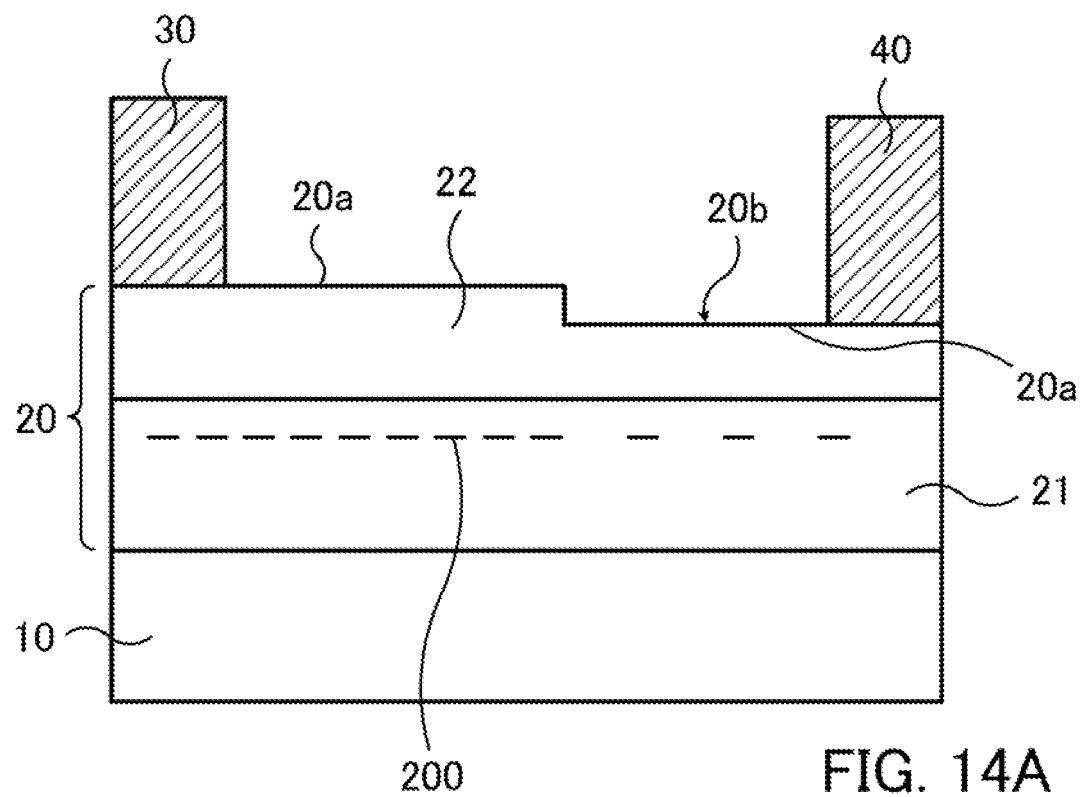
FIGS. 14A and 14B are views for describing an example of a method for fabricating a semiconductor device according to an eighth embodiment (part 2)

Next, as illustrated in FIG. 14A, a source electrode 30 and the drain electrode 40 are formed over the surface 20a of the semiconductor layer 20. For example, first a resist film having openings over a region where the source electrode 30 is to be formed (source electrode formation scheduled region) 31 and the drain electrode formation scheduled region 41 (FIG. 13B) is formed by the use of the photolithography technique. In addition, Ti is deposited over the whole surface. Al is deposited over Ti. The resist film and Ti and Al deposited thereover are removed (lift off method). By doing so, the source electrode 30 and the drain electrode 40 each having a laminated structure of Ti and Al are formed over the source electrode formation scheduled region 31 and the drain electrode formation scheduled region 41, respectively, of the semiconductor layer 20. After that, heat treatment is performed in an atmosphere of nitrogen at a temperature of 400 to 1000° C. By doing so, an ohmic connection of the source electrode 30 and the drain electrode 40 is established. If an ohmic connection is established by forming electrode metal for the source electrode 30 and the drain electrode 40, then heat treatment is not always needed.

Figure 14B:
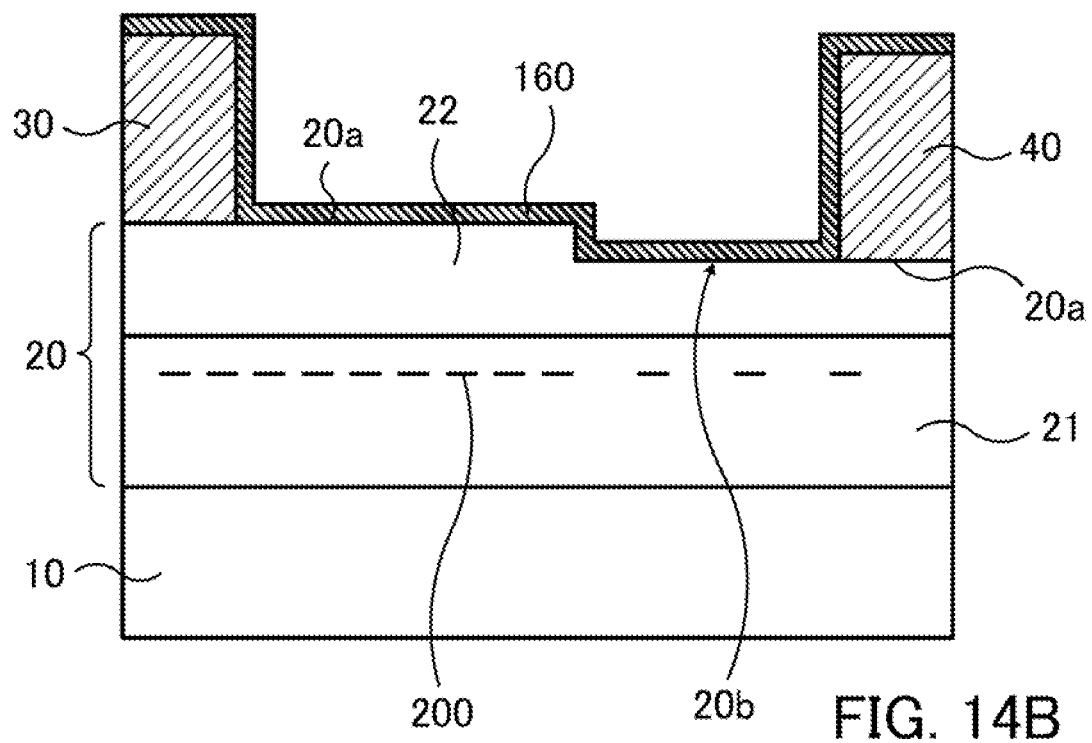

Next, as illustrated in FIG. 14B, an insulating film 160 is formed over the surface 20a of the semiconductor layer 20. The insulating film 160 is the insulating film 60 (SiN, for example) in the above second, third, fourth, fifth, or seventh embodiment or the insulating film 60A ($Al_2O_3$, for example) in the above sixth embodiment. If an SiN film is formed as the insulating film 160 (if the above insulating film 60 is formed), then an SiN film having a thickness of about 10 to 100 nm is deposited over the semiconductor layer 20 by the use of a plasma CVD method. For example, an SiN film having a thickness of 40 nm is deposited. Furthermore, if an $Al_2O_3$ film is formed as the insulating film 160 (if the above insulating film 60A is formed), then an $Al_2O_3$ film having a thickness of about 1 to 100 nm is deposited over the semiconductor layer 20 by the use of an atomic layer deposition (ALD) method. For example, an $Al_2O_3$ film having a thickness of 10 nm is deposited. As illustrated in FIG. 14B, an SiN film deposited by the use of the plasma CVD method or an $Al_2O_3$ film deposited by the use of the ALD method may be deposited not only over the semiconductor layer 20 but also over the source electrode 30 and the drain electrode 40.

Figure 15A:
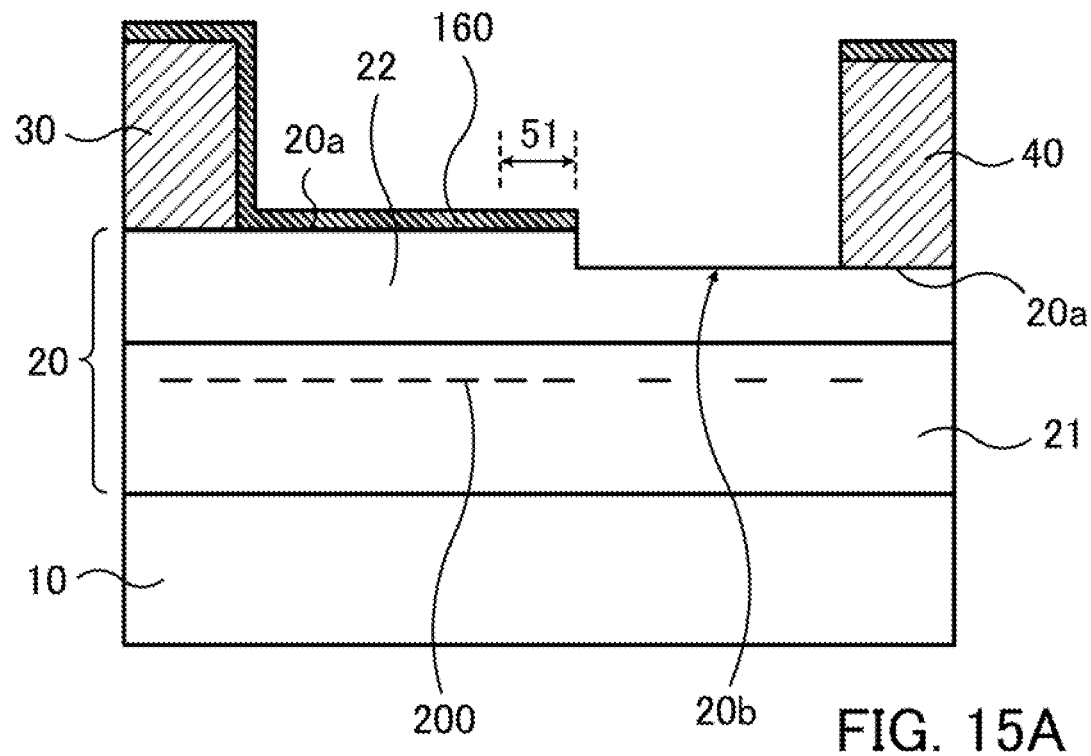
FIGS. 15A and 15B are views for describing an example of a method for fabricating a semiconductor device according to an eighth embodiment (part 3)

Next, as illustrated in FIG. 15A, the insulating film 160 between the gate electrode formation scheduled region 51 and the drain electrode 40 over the surface 20a of the semiconductor layer 20, that is to say, the insulating film 160 in the concave portion 20b of the semiconductor layer 20 is removed. For example, first a resist film having an opening over the portion between the gate electrode formation scheduled region 51 and the drain electrode 40 is formed by the use of the photolithography technique. Furthermore, if an SiN film is formed as the insulating film 160, then the insulating film 160 exposed in the opening of the resist film is removed by dry etching using fluorine-based gas. Moreover, if an $Al_2O_3$ film is formed as the insulating film 160, then the insulating film 160 exposed in the opening of the resist film is removed by wet etching using tetra-methyl-ammonium hydroxide (TMAH). After the insulating film 160 is partially removed, the surface 20a of the semiconductor layer 20 (inside of the concave portion 20b) is exposed between the gate electrode formation scheduled region 51 and the drain electrode 40.

Figure 15B:
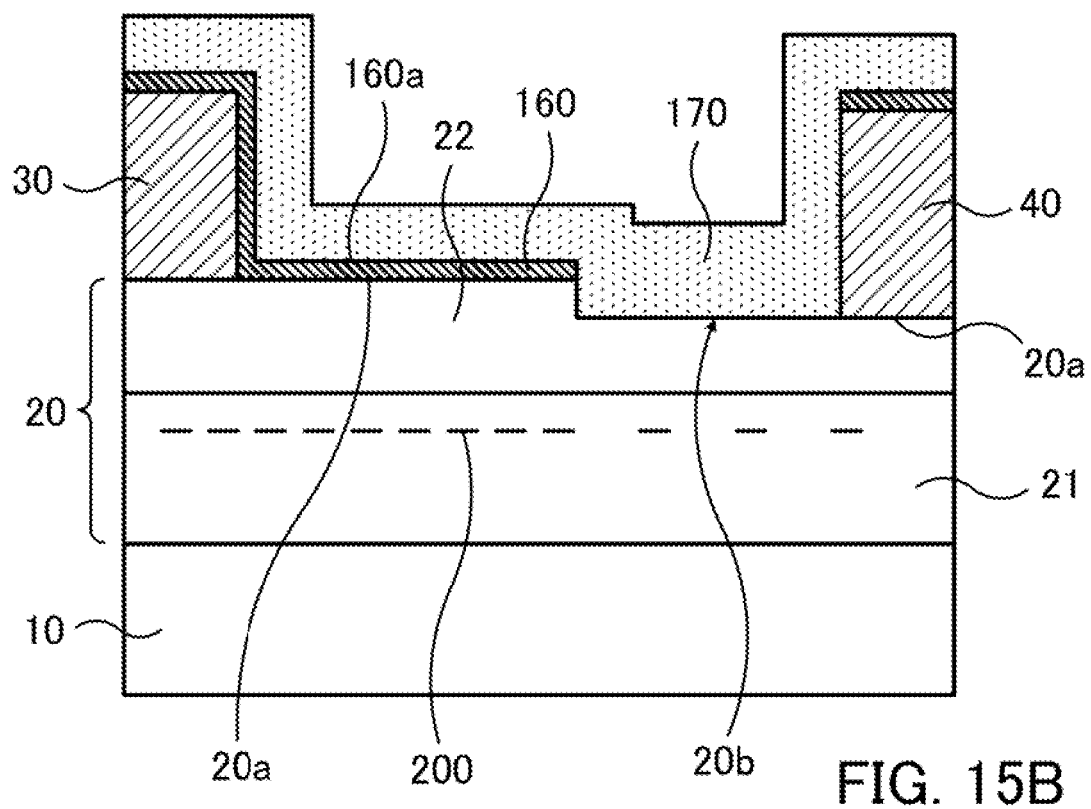

Next, as illustrated in FIG. 15B, a diamond layer 170 is formed over a surface 160a of the insulating film 160 opposite to the surface 20a of the semiconductor layer 20 and over the surface 20a of the semiconductor layer 20 (concave portion 20b) exposed by partially removing the insulating film 160. For example, first powdered diamond (seed diamond) is located over the insulating film 160 and the surface 20a of the semiconductor layer 20 (concave portion 20b). Furthermore, the diamond layer 170 having a polycrystalline structure and a thickness of 10 to 1000 nm is formed by a thermal CVD method. In this case, $CH_4$ and $H_2$ are used as material gas and film formation temperature is 700 to 900° C. For example, the diamond layer 170 having a thickness of 50 nm is formed.

Figure 16A:
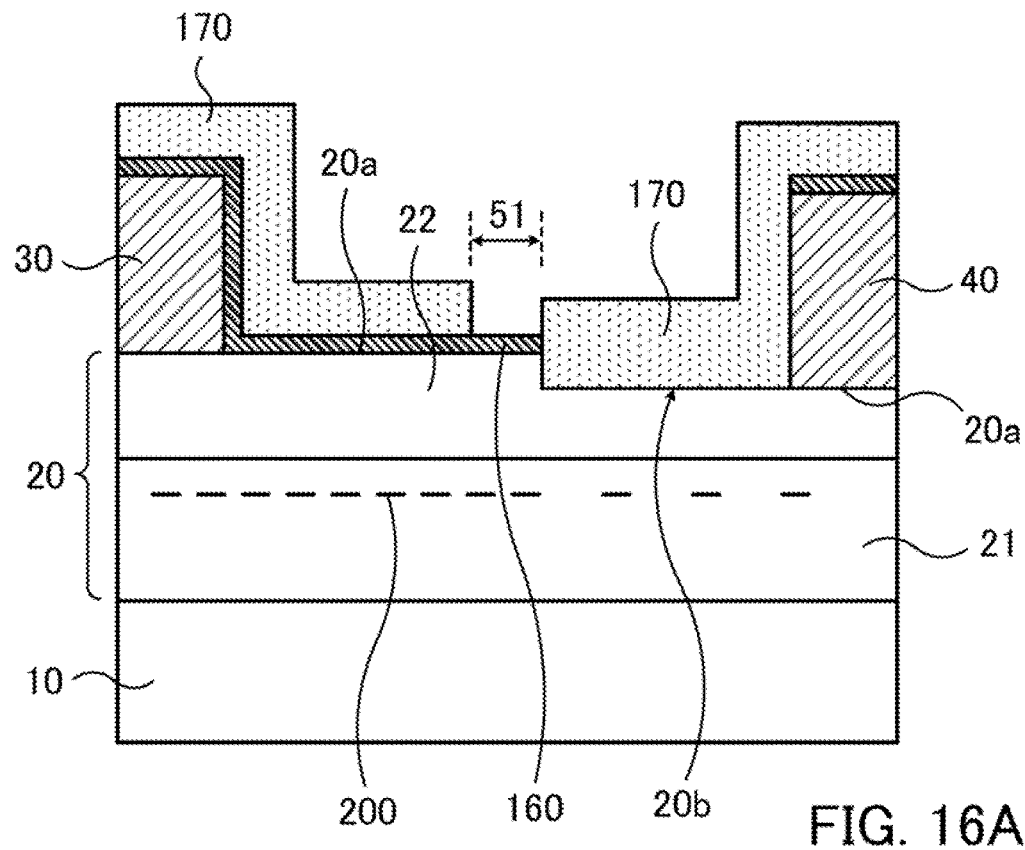
FIGS. 16A and 16B are views for describing an example of a method for fabricating a semiconductor device according to an eighth embodiment (part 4)

Next, as illustrated in FIG. 16A, the diamond layer 170 over the gate electrode formation scheduled region 51 is partially removed. For example, first a resist film having an opening over the gate electrode formation scheduled region 51 is formed by the use of the photolithography technique. Furthermore, the diamond layer 170 exposed in the opening of the resist film is removed by dry etching using oxygen gas. After the diamond layer 170 is removed, the insulating film 160 is exposed over the gate electrode formation scheduled region 51.

A region between the gate electrode formation scheduled region 51 and the source electrode 30, of the surface 20a of the semiconductor layer 20, is also referred to as a source electrode 30 side region. A region between the gate electrode formation scheduled region 51 and the drain electrode 40, of the surface 20a of the semiconductor layer 20, is also referred to as a drain electrode 40 side region. The gate electrode formation scheduled region 51 is situated between the source electrode 30 side region and the drain electrode 40 side region.

After the diamond layer 170 is removed, a portion of the diamond layer 170 which remains over the source electrode 30 side region functions as the above diamond layer 70 and a portion of the diamond layer 170 which remains over the drain electrode 40 side region functions as the above diamond layer 80.

Figure 16B:
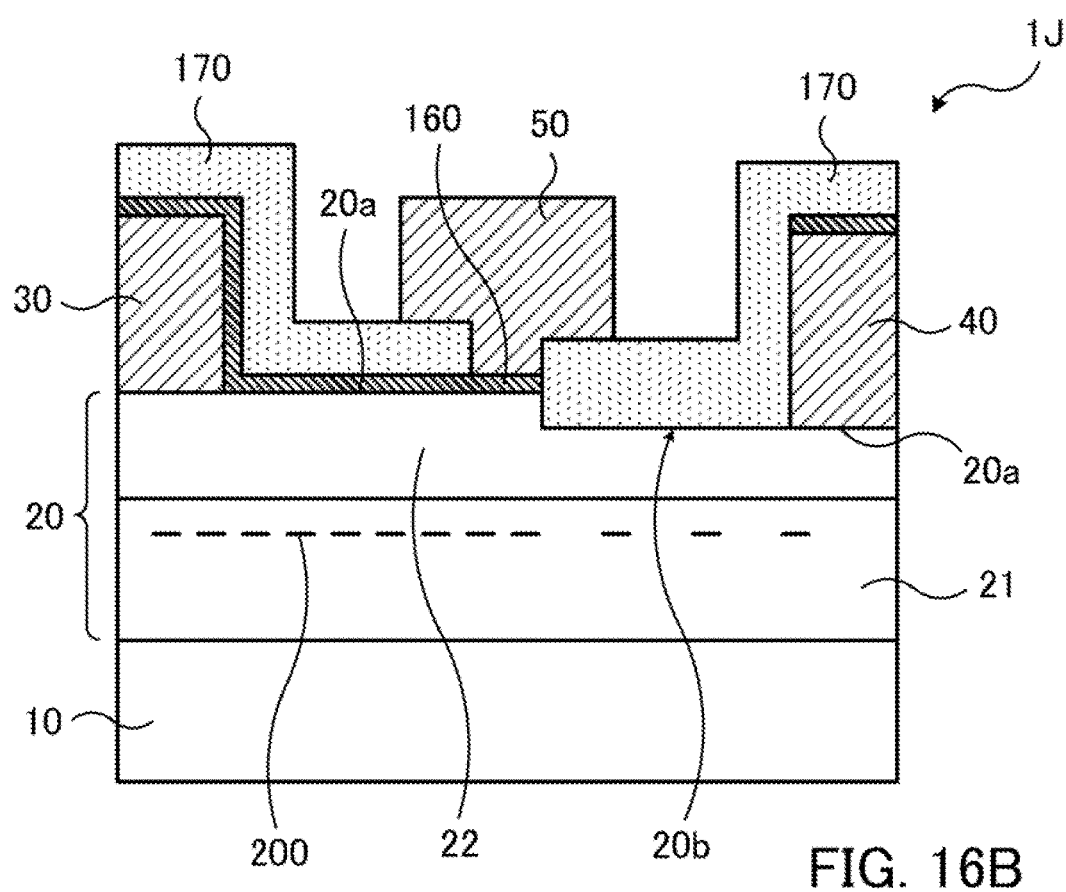

Next, as illustrated in FIG. 16B, the gate electrode 5C is formed over the gate electrode formation scheduled region 51 (FIG. 16A) over which the insulating film 160 is exposed by removing the diamond layer 170. For example, first a resist film having an opening over the gate electrode formation scheduled region 51 is formed by the use of the photolithography technique. In addition, Ni is deposited over the whole surface. Au is deposited over Ni. The resist film and Ni and Au deposited thereover are removed (lift off method). By doing so, the gate electrode 50 having a laminated structure of Ni and Au is formed over the gate electrode formation scheduled region 51 of the semiconductor layer 20. After electrode metal for the gate electrode 50 is formed, heat treatment may be performed.

A semiconductor device 1J including as basic organization a structure like that of the above semiconductor device 1E according to the fifth embodiment (FIG. 9) or including as basic organization a structure like that of the above semiconductor device 1F according to the sixth embodiment (FIG. 10) is fabricated by performing the processes illustrated in FIGS. 13A through 16B.

If a semiconductor device including a structure like that of the above semiconductor device 1A according to the second embodiment (FIG. 2) is fabricated, then the above process illustrated in FIG. 13B is not performed. Furthermore, in the above process illustrated in FIG. 15A, not only the insulating film 160 over a region of the surface 20a of the semiconductor layer 20 between the gate electrode formation scheduled region 51 and the drain electrode 40 but also the insulating film 160 over the gate electrode formation scheduled region 51 of the surface 20a of the semiconductor layer 20 is removed. The other processes are performed in accordance with the above example of a fabrication method.

Furthermore, if a semiconductor device including a structure like that of the above semiconductor device 1B according to the third embodiment (FIG. 6) is fabricated, then a concave portion 20b is formed in a portion of the semiconductor layer 20 between the gate electrode formation scheduled region 51 and the drain electrode formation scheduled region 41 in the above process illustrated in FIG. 13B. In addition, in the above process illustrated in FIG. 15A, the insulating film 160 over the gate electrode formation scheduled region 51 of the surface 20a of the semiconductor layer 20 is also removed. The other processes are performed in accordance with the above example of a fabrication method.

Furthermore, if a semiconductor device including a structure like that of the above semiconductor device 1C according to the third embodiment (FIG. 7) is fabricated, then the insulating film 160 over the gate electrode formation scheduled region 51 of the surface 20a of the semiconductor layer 20 is also removed in the above process illustrated in FIG. 15A. The other processes are performed in accordance with the above example of a fabrication method.

Furthermore, if a semiconductor device including a structure like that of the above semiconductor device 1D according to the fourth embodiment (FIG. 8) is fabricated, then the semiconductor layer 20 including the cap layer 90 formed over the electron supply layer 22 is formed in the above process illustrated in FIG. 13A. In the above process illustrated in FIG. 15A, the insulating film 160 over the gate electrode formation scheduled region 51 of the surface 20a of the semiconductor layer 20 is also removed. The other processes are performed in accordance with the above example of a fabrication method.

Figure 17A:
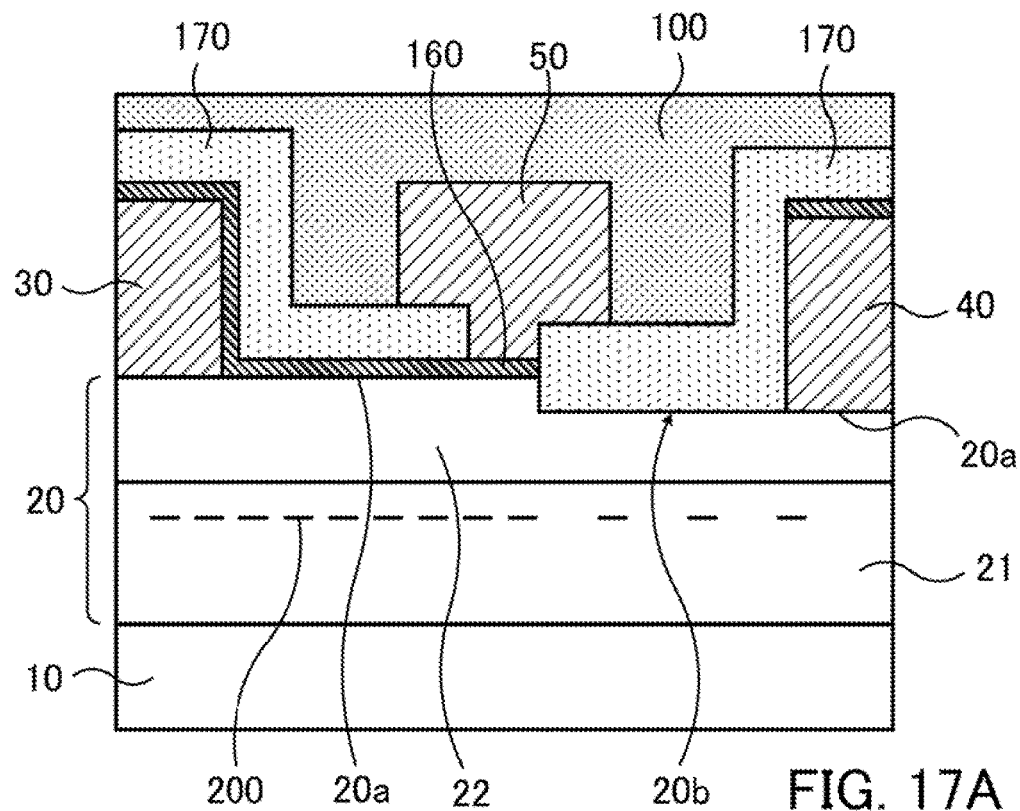
FIGS. 17A and 17B are views for describing an example of a method for fabricating a semiconductor device according to an eighth embodiment (part 5)
Figure 17B:
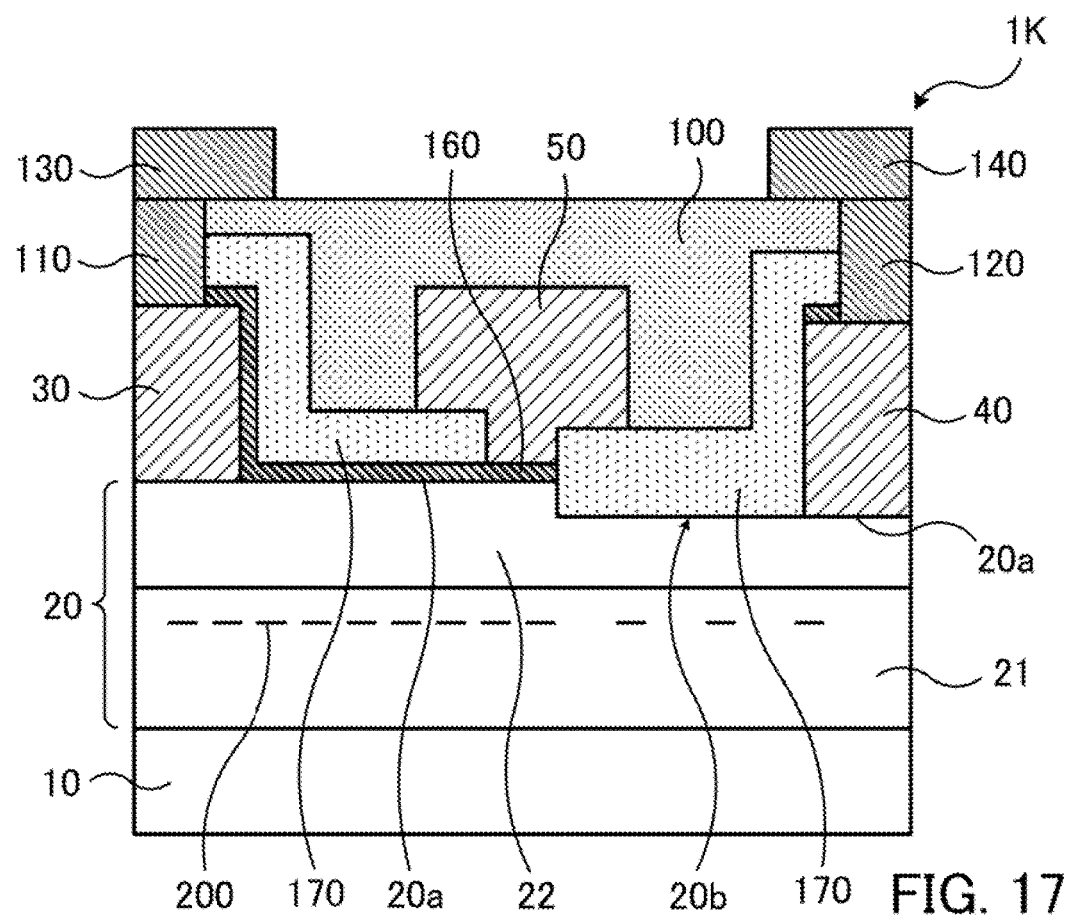

For example, after the above semiconductor device 1J illustrated in FIG. 16B is formed, processes illustrated in FIGS. 17A and 17B are performed further.

As illustrated in FIG. 17A, first a diamond layer 100 is formed so as to cover the semiconductor device 1J formed. The diamond layer 100 is formed by the same way that is used for forming the above diamond layer 170.

Next, as illustrated in FIG. 17B, penetration holes which pierce the diamond layer 100, the diamond layer 170, and the insulating film 160 and which reach the source electrode 30 and the drain electrode 40 are made. Furthermore, a via 110 and a via 120 are formed in the penetration holes. Moreover, a wiring 130 and a wiring 140 connected to the via 110 and the via 120, respectively, are formed over the diamond layer 100. A via (not illustrated) connected to the gate electrode 50 and a wiring (not illustrated) connected to the via are also formed in the same way.

After the processes illustrated in FIGS. 13A through 16B are performed, the processes illustrated in FIGS. 17A and 17B are performed. By doing so, a semiconductor device 1K including as basic organization a structure like that of the above semiconductor device 1G according to the seventh embodiment (FIG. 11) is fabricated.

Furthermore, a diamond layer 150 may be formed on a surface 10b of the substrate 10 of the semiconductor device 1K opposite to the semiconductor layer 20 in accordance with the example of the above semiconductor device 1H according to the seventh embodiment (FIG. 12).

The first through eighth embodiments have been described.

With the semiconductor devices 1, 1A, 1B, 1C, 1D, 1E, 1F, 1G, 1H, 1J, 1K, and the like described in the first through eighth embodiments, the distance between the gate electrode 50 and the drain electrode 40 may be greater than the distance between the gate electrode 50 and the source electrode 30. That is to say, what is called an asymmetric structure may be adopted. The adoption of an asymmetric structure relaxes an electric field between the gate electrode 50 and the drain electrode 40 or improves a breakdown voltage.

Furthermore, the semiconductor devices 1, 1A, 1B, 1C, 1D, 1E, 1F, 1G, 1H, 1J, 1K, and the like described in the first through eighth embodiments may be applied to various electronic devices. For example, cases where the semiconductor devices having the above structures are applied to a semiconductor package, a power factor correction circuit, a power supply device, and an amplifier will now be described further.

Ninth Embodiment

An example of the application of the semiconductor devices having the above structures to a semiconductor package will now be described as a ninth embodiment.

Figure 18:
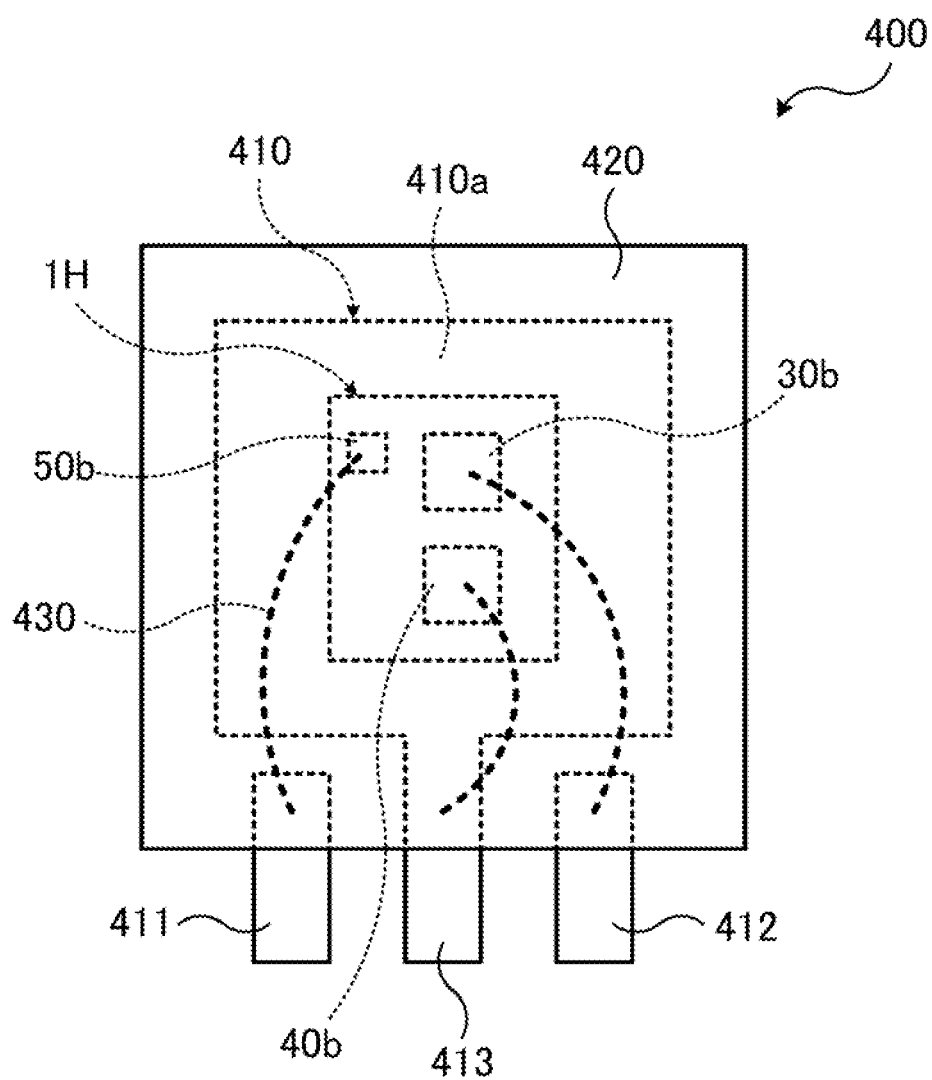
FIG. 18 is a view for describing an example of a semiconductor package according to a ninth embodiment.

FIG. 18 is a view for describing an example of a semiconductor package according to a ninth embodiment. FIG. 18 is a fragmentary schematic plan view of an example of a semiconductor package.

A semiconductor package 400 illustrated in FIG. 18 is an example of a discrete package. For example, the semiconductor package 400 includes the above semiconductor device 1H according to the seventh embodiment (FIG. 12), a lead frame 410 over which the semiconductor device 1H is mounted, and resin 420 which seals them.

The semiconductor device 1H is mounted over a die pad 410a of the lead frame 410 by the use of a die attaching agent or the like (not illustrated). A pad 50b connected to the above gate electrode 50, a pad 30b connected to the source electrode 30, and a pad 40b connected to the drain electrode 40 are formed on the semiconductor device 1H. The pad 50b, the pad 30b, and the pad 40b are connected to a gate lead 411, a source lead 412, and a drain lead 413, respectively of the lead frame 410 by the use of wires 430 made of Al or the like. The lead frame 410, the semiconductor device 1H mounted over the lead frame 410, and the wires 430 which connect the lead frame 410 and the semiconductor device 1H are sealed with the resin 420 so that part of each of the gate lead 411, the source lead 412, and the drain lead 413 will be exposed.

For example, the above semiconductor device 1H according to the seventh embodiment is used and the semiconductor package 400 is obtained. With the semiconductor device 1H the diamond layer 70 is located between the gate electrode 50 and the source electrode 30 and the diamond layer 80 is located between the gate electrode 50 and the drain electrode 40 so as to be in contact with the semiconductor layer 20. As a result, heat generated by the semiconductor layer 20 of the semiconductor device 1H which operates by applying a comparatively high voltage to the drain electrode 40 is efficiently transferred to the diamond layer 80 and the like. This effectively suppresses an overheat of the semiconductor device 1H or a failure or degradation of the characteristics of the transistor caused by it. Furthermore, with the semiconductor device 1H a portion of the electron supply layer 22 between the gate electrode 50 and the drain electrode 40 is thinner than another portion of the electron supply layer 22. This lowers the concentration of the 2DEG 200 between the gate electrode 50 and the drain electrode 40 and a high breakdown voltage is realized. Moreover, with the semiconductor device 1H part of the insulating film 60 (or the insulating film 60A) intervenes between the gate electrode 50 and the semiconductor layer 20. For example, this suppresses a leakage current, improves the heat resistance of the gate electrode 50, and suppresses a drop in gate forward rising voltage. The semiconductor device 1H having such good performance is used and a high-performance and high-quality semiconductor package 400 is realized.

In this example the semiconductor device 1H is used. However, a high-performance and high-quality semiconductor package is obtained in the same way by the use of the semiconductor device 1, 1A, 1B, 1C, 1D, 1E, 1F, 1G, 1J, 1K, or the like.

Tenth Embodiment

An example of the application of the semiconductor devices having the above structures to a power factor correction circuit will now be described as a tenth embodiment.

Figure 19:
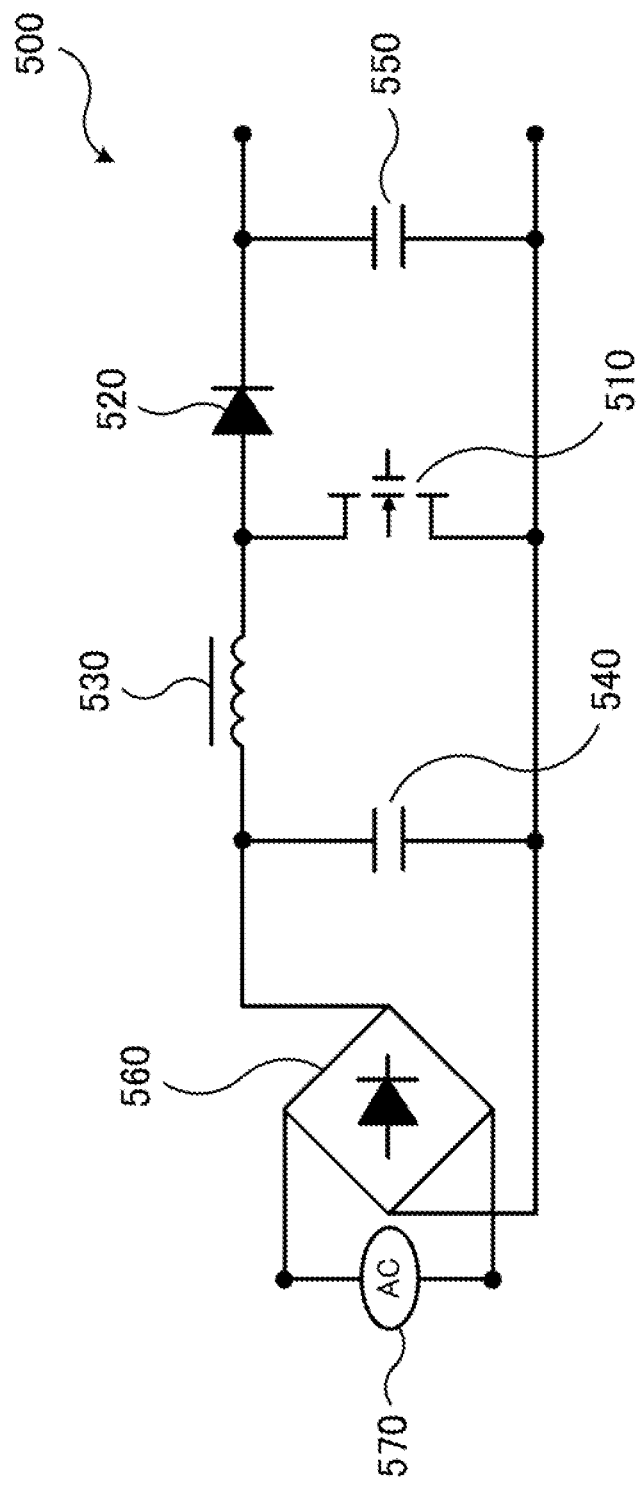
FIG. 19 is a view for describing an example of a power factor correction circuit according to a tenth embodiment.

FIG. 19 is a view for describing an example of a power factor correction circuit according to a tenth embodiment. FIG. 19 is an equivalent circuit diagram of an example of a power factor correction circuit.

A power factor correction (PFC) circuit 500 illustrated in FIG. 19 includes a switching element 510, a diode 520, a choke coil 530, a condenser 540, a condenser 550, a diode bridge 560, and an alternating-current power supply 570 (AC).

In the PFC circuit 500, a drain electrode of the switching element 510, an anode terminal of the diode 520, and one terminal of the choke coil 530 are connected. A source electrode of the switching element 510, one terminal of the condenser 540, and one terminal of the condenser 550 are connected. The other terminal of the condenser 540 and the other terminal of the choke coil 530 are connected. The other terminal of the condenser 550 and a cathode terminal of the diode 520 are connected. Furthermore, a gate driver is connected to a gate electrode of the switching element 510. The alternating-current power supply 570 is connected via the diode bridge 560 between both terminals of the condenser 540 and a direct-current power supply (DC) is taken from between both terminals of the condenser 550.

For example, the above semiconductor device 1H or the semiconductor device 1, 1A, 1B, 1C, 1D, 1E, 1F, 1G, 1J, 1K, or the like is used as the switching element 510 included in the PFC circuit 500 having the above structure. As stated above, with the semiconductor device 1H or the like heat generated by the semiconductor layer 20 is efficiently transferred to the diamond layer 80 and the like. As a result, for example, the effect of suppression of an overheat or the effect of suppression of a failure or degradation of characteristics caused by the overheat is obtained. The semiconductor device 1H or the like having good performance is used and a high-performance and high-quality PFC circuit 500 is realized.

Eleventh Embodiment

An example of the application of the semiconductor devices having the above structures to a power supply device will now be described as an eleventh embodiment.

Figure 20:
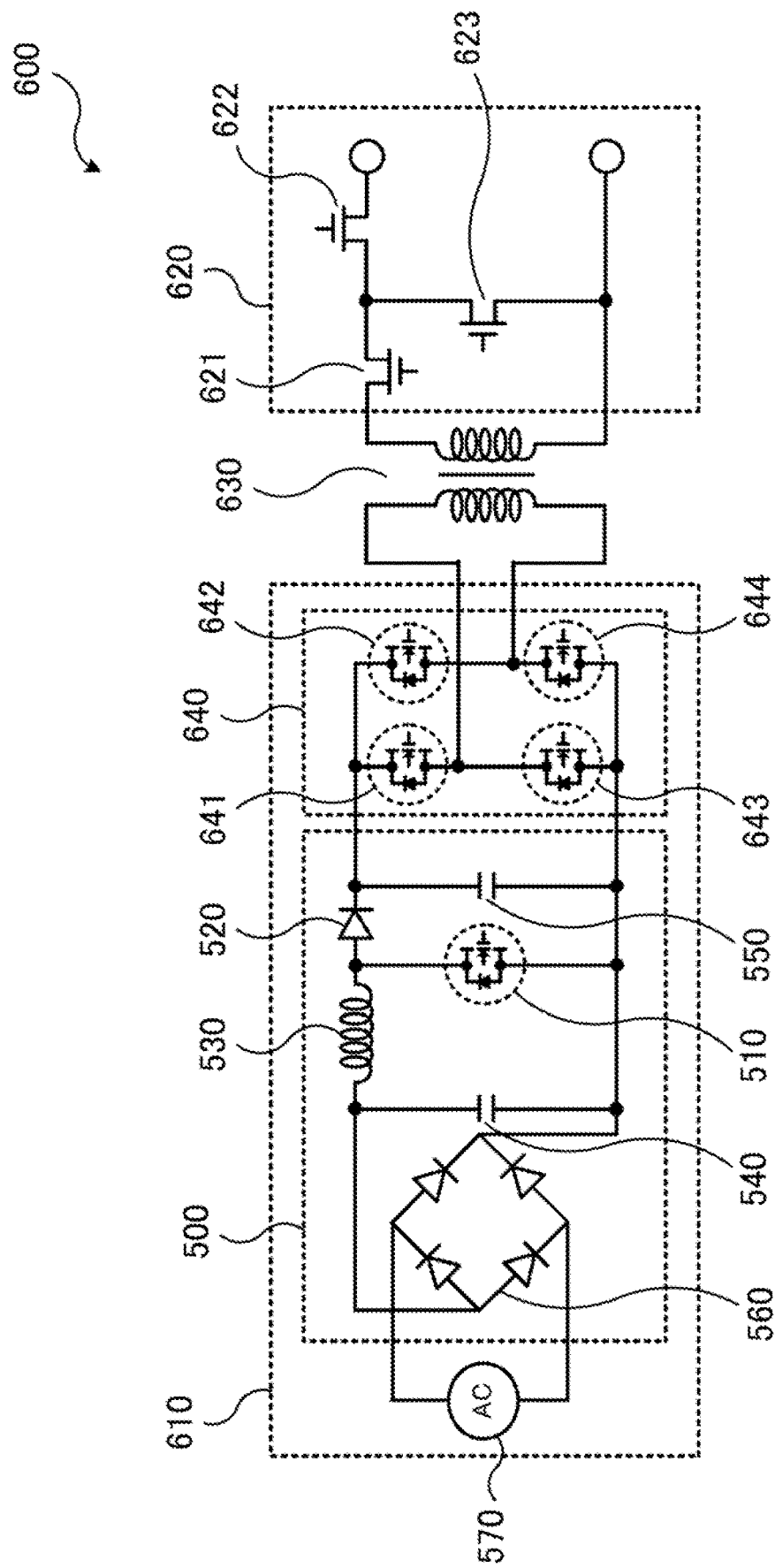
FIG. 20 is a view for describing an example of a power supply device according to an eleventh embodiment.

FIG. 20 is a view for describing an example of a power supply device according to an eleventh embodiment. FIG. 20 is an equivalent circuit diagram of an example of a power supply device.

A power supply device 600 illustrated in FIG. 20 includes a high-voltage primary-side circuit 610, a low-voltage secondary-side circuit 620, and a transformer 630 located between the primary-side circuit 610 and the secondary-side circuit 620. The primary-side circuit 610 includes the PFC circuit 500 described in the above tenth embodiment and an inverter circuit, such as a full-bridge inverter circuit 640 connected between both terminal of the condenser 550 of the PFC circuit 500. The full-bridge inverter circuit 640 includes a plurality of switching elements. In this example, the full-bridge inverter circuit 640 includes four switching elements 641, 642, 643, and 644. The secondary-side circuit 620 includes a plurality of switching elements. In this example, the secondary-side circuit 620 includes three switching elements 621, 622, and 623.

For example, the above semiconductor device 1H or the semiconductor device 1, 1A, 1B, 1C, 1D, 1E, 1F, 1G, 1J, 1K, or the like is used as the switching element 510 of the PFC circuit 500 or the switching elements 641 through 644 of the full-bridge inverter circuit 640 included in the primary-side circuit 610 of the power supply device 600 having the above structure. For example, ordinary MIS-type FETs made of silicon are used as the switching elements 621 through 623 of the secondary-side circuit 620 of the power supply device 600. As stated above, with the semiconductor device 1H or the like heat generated by the semiconductor layer 20 is efficiently transferred to the diamond layer 80 and the like. As a result, for example, the effect of suppression of an overheat or the effect of suppression of a failure or degradation of characteristics caused by the overheat is obtained. The semiconductor device 1H or the like having good performance is used and a high-performance and high-quality power supply device 600 is realized.

Twelfth Embodiment

An example of the application of the semiconductor devices having the above structures to an amplifier will now be described as a twelfth embodiment.

Figure 21:
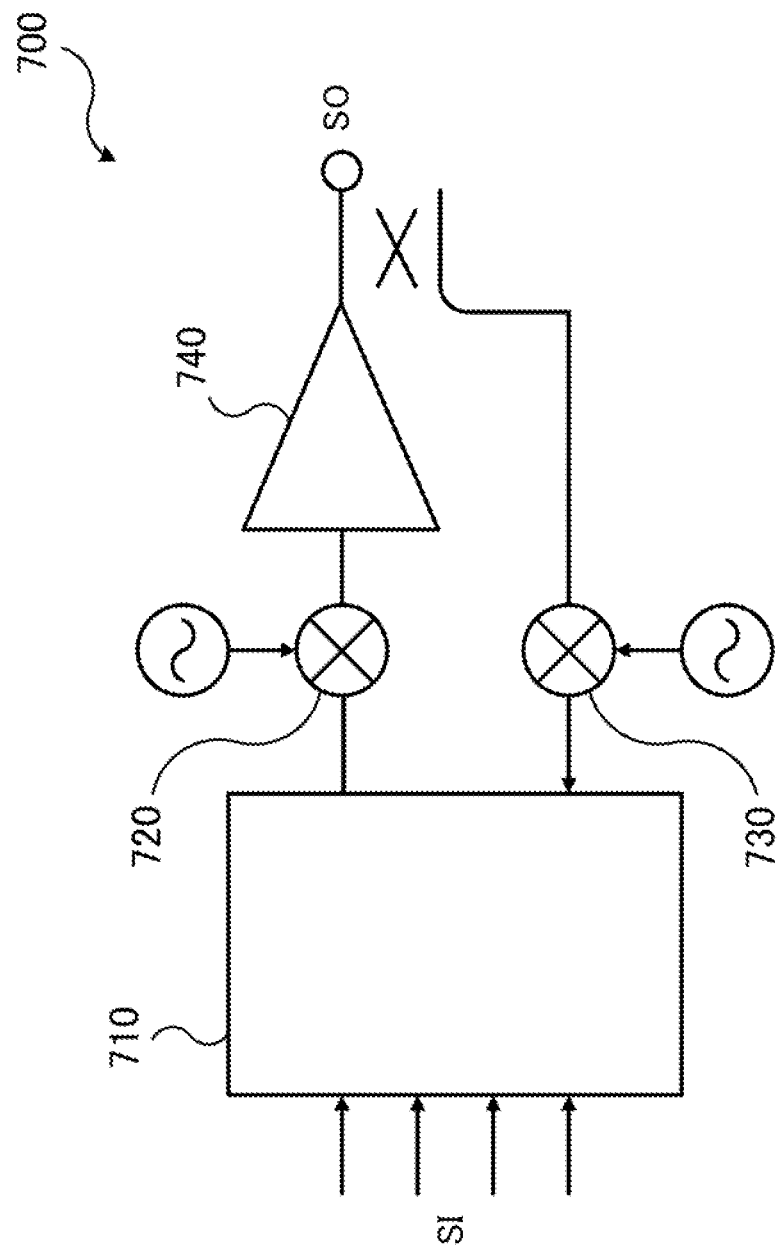
FIG. 21 is a view for describing an example of an amplifier according to a twelfth embodiment.

FIG. 21 is a view for describing an example of an amplifier according to a twelfth embodiment. FIG. 21 is an equivalent circuit diagram of an example of an amplifier.

An amplifier 700 illustrated in FIG. 21 includes a digital predistortion circuit 710, a mixer 720, a mixer 730, and a power amplifier 740.

The digital predistortion circuit 710 compensates for nonlinear distortion of an input signal. The mixer 720 mixes an input signal SI whose nonlinear distortion has been compensated for with an alternating-current signal. The power amplifier 740 amplifies the input signal SI mixed with the alternating-current signal. With the amplifier 700, for example, an output signal SO is mixed with an alternating-current signal by the mixer 730 and is transmitted to the digital predistortion circuit 710, by switching a switch. The amplifier 700 is used as a high-frequency amplifier or a high output amplifier.

For example, the above semiconductor device 1H or the semiconductor device 1, 1A, 1B, 1C, 1D, 1E, 1F, 1G, 1J, 1K, or the like is used as the power amplifier 740 of the amplifier 700 having the above structure. As stated above, with the semiconductor device 1H or the like heat generated by the semiconductor layer 20 is efficiently transferred to the diamond layer 80 and the like. As a result, for example, the effect of suppression of an overheat or the effect of suppression of a failure or degradation of characteristics caused by the overheat is obtained. The semiconductor device 1H or the like having good performance is used and a high-performance and high-quality amplifier 700 is realized.

Various electronic devices (such as the semiconductor package 400, the PFC circuit 500, the power supply device 600, and the amplifier 700 described in the above ninth through twelfth embodiments respectively) to which the above semiconductor device 1, 1A, 1B, 1C, 1D, 1E, 1F, 1G, 1H, 1J, 1K, or the like is applied are mounted in various electronic apparatus such as computers (personal computers, supercomputers, servers, and the like), smartphones, portable telephones, tablet terminals, sensors, cameras, audio equipment, measuring equipment, inspection equipment, and manufacturing equipment.

According to an aspect, a semiconductor device having an excellent heat dissipation property is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a semiconductor layer;
a source electrode and a drain electrode located apart from each other over a first surface of the semiconductor layer;
a gate electrode located between the source electrode and the drain electrode;
a first insulating film located between the gate electrode and the source electrode over the first surface;
a first diamond layer located over a second surface of the first insulating film opposite to the first surface; and
a second diamond layer located between the gate electrode and the drain electrode over the first surface so as to be in contact with the first surface.

2. The semiconductor device according to claim 1, wherein:
the semiconductor layer includes:
an electron transit layer formed by using a first compound semiconductor; and
an electron supply layer located opposite the electron transit layer and formed by using a second compound semiconductor different from the first compound semiconductor; and
the semiconductor layer has the first surface on a side of the electron supply layer.

3. The semiconductor device according to claim 2, wherein:
the electron supply layer has a concave portion formed between the gate electrode and the drain electrode;
the first surface includes an inside of the concave portion; and
the second diamond layer is formed in the concave portion so as to be in contact with the inside.

4. The semiconductor device according to claim 2, wherein a portion of the electron supply layer between the gate electrode and the drain electrode is thinner than a portion of the electron supply layer between the gate electrode and the source electrode.

5. The semiconductor device according to claim 1, further comprising:
a second insulating film intervening between the gate electrode and the first surface.

6. The semiconductor device according to claim 5, wherein the first insulating film and the second insulating film are integrally formed.

7. The semiconductor device according to claim 1, wherein an edge of the gate electrode on a side of the drain electrode nearest the first surface is in contact with the second diamond layer.

8. The semiconductor device according to claim 1, further comprising:
   a third diamond layer which is located on a side of the first surface of the semiconductor layer and which covers the first diamond layer and the second diamond layer.

9. The semiconductor device according to claim 1, further comprising:
   a fourth diamond layer located on a side of a third surface of the semiconductor layer opposite to the first surface.

10. An electronic device comprising:
   a semiconductor device including:
   a semiconductor layer;
   a source electrode and a drain electrode located apart from each other over a first surface of the semiconductor layer;
   a gate electrode located between the source electrode and the drain electrode;
   a first insulating film located between the gate electrode and the source electrode over the first surface;
   a first diamond layer located over a second surface of the first insulating film opposite to the first surface; and
   a second diamond layer located between the gate electrode and the drain electrode over the first surface so as to be in contact with the first surface.

* * * * *